(12) United States Patent
Negishi et al.

(10) Patent No.: US 8,319,503 B2
(45) Date of Patent: Nov. 27, 2012

(54) TEST APPARATUS FOR MEASURING A CHARACTERISTIC OF A DEVICE UNDER TEST

(75) Inventors: Kazuki Negishi, Hillsboro, OR (US); Mark Hansen, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 409 days.

(21) Appl. No.: 12/590,955

(22) Filed: Nov. 16, 2009

(65) Prior Publication Data

US 2010/0127714 A1    May 27, 2010

Related U.S. Application Data

(60) Provisional application No. 61/200,187, filed on Nov. 24, 2008.

(51) Int. Cl.
G01R 29/26    (2006.01)
G01R 31/20    (2006.01)

(52) U.S. Cl. ............... 324/613; 324/754.11; 324/756.06

(58) Field of Classification Search .................. None
See application file for complete search history.

(56) References Cited

U.S. PATENT DOCUMENTS

| | | |
|---|---|---|
| 1,191,486 A | 7/1916 | Tyler |
| 1,337,866 A | 4/1920 | Whitacker |
| 2,106,003 A | 1/1938 | Hewitt |
| 2,142,625 A | 1/1939 | Zoethout |
| 2,197,081 A | 4/1940 | Piron |
| 2,264,685 A | 12/1941 | Wells et al. |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |

(Continued)

FOREIGN PATENT DOCUMENTS

CN    1083975    3/1994

(Continued)

OTHER PUBLICATIONS

"Cascade Microtech Officers Industry's First Fully Integrated Flicker Noise Measurement System", (May 29, 2008) [online], [retrieved on Feb. 15, 2010], Retrieved from the Embedded Computing web site using the Internet, <URL: http://embedded-computing.com/cascade-noise-measurement-system>.

(Continued)

Primary Examiner — Minh N Tang
(74) Attorney, Agent, or Firm — DASCENZO Intellectual Property Law, P.C.

(57) ABSTRACT

A flicker noise test system includes a guarded signal path and an unguarded signal path selectively connectable to respective terminals of a device under test. The selected signal path is connectable a terminal without disconnecting cables or changing probes.

23 Claims, 18 Drawing Sheets

U.S. PATENT DOCUMENTS

| | | |
|---|---|---|
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,831,494 A | 5/1989 | Arnold et al. |

| Patent No. | Date | Inventor |
|---|---|---|
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |
| 4,853,613 A | 8/1989 | Sequeira et al. |
| 4,853,624 A | 8/1989 | Rabjohn |
| 4,853,627 A | 8/1989 | Gleason et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,864,227 A | 9/1989 | Sato |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,918,383 A | 4/1990 | Huff et al. |
| 4,922,128 A | 5/1990 | Dhong et al. |
| 4,922,186 A | 5/1990 | Tsuchiya et al. |
| 4,923,407 A | 5/1990 | Rice et al. |
| 4,926,118 A | 5/1990 | O'Connor et al. |
| 4,929,893 A | 5/1990 | Sato et al. |
| 4,933,634 A | 6/1990 | Cuzin et al. |
| 4,961,050 A | 10/1990 | Harwood et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,047,725 A | 9/1991 | Strid et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,082,627 A | 1/1992 | Stanbro |
| 5,084,671 A | 1/1992 | Miyata et al. |
| 5,089,774 A | 2/1992 | Nakano |
| 5,091,691 A | 2/1992 | Kamieniecki et al. |
| 5,091,692 A | 2/1992 | Ohno et al. |
| 5,091,732 A | 2/1992 | Mileski et al. |
| 5,094,536 A | 3/1992 | MacDonald et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,136,237 A | 8/1992 | Smith et al. |
| 5,142,224 A | 8/1992 | Smith et al. |
| 5,144,228 A | 9/1992 | Sorna et al. |
| 5,159,262 A | 10/1992 | Rumbaugh et al. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,164,661 A | 11/1992 | Jones |
| 5,166,606 A | 11/1992 | Blanz |
| 5,172,049 A | 12/1992 | Kiyokawa et al. |
| 5,172,051 A | 12/1992 | Zamborelli |
| 5,187,443 A | 2/1993 | Bereskin |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,210,377 A | 5/1993 | Kennedy et al. |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,227,730 A | 7/1993 | King et al. |
| 5,232,789 A | 8/1993 | Platz et al. |
| 5,233,197 A | 8/1993 | Bowman et al. |
| 5,233,291 A | 8/1993 | Kouno et al. |
| 5,233,306 A | 8/1993 | Misra |
| 5,237,267 A | 8/1993 | Harwood et al. |
| 5,245,292 A | 9/1993 | Milesky et al. |
| 5,264,788 A | 11/1993 | Smith |
| 5,266,889 A | 11/1993 | Harwood et al. |
| 5,267,088 A | 11/1993 | Nomura |
| 5,270,664 A | 12/1993 | McMurtry et al. |
| 5,274,336 A | 12/1993 | Crook et al. |
| 5,278,494 A | 1/1994 | Obigane |
| 5,280,156 A | 1/1994 | Niori et al. |
| 5,298,972 A | 3/1994 | Heffner |
| 5,303,938 A | 4/1994 | Miller et al. |
| 5,304,924 A | 4/1994 | Yamano et al. |
| 5,309,088 A | 5/1994 | Chen |
| 5,315,237 A | 5/1994 | Iwakura et al. |
| 5,321,352 A | 6/1994 | Takebuchi |
| 5,321,453 A | 6/1994 | Mori et al. |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,357,211 A | 10/1994 | Bryson et al. |
| 5,363,050 A | 11/1994 | Guo et al. |
| 5,369,368 A | 11/1994 | Kassen et al. |
| 5,369,370 A | 11/1994 | Stratmann et al. |
| 5,371,457 A | 12/1994 | Lipp |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |

| | | |
|---|---|---|
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,818,219 A | 10/1998 | Hama et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine et al. |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,970,429 A | 10/1999 | Martin |
| 5,973,505 A | 10/1999 | Strid et al. |
| 5,974,662 A | 11/1999 | Eldridge et al. |
| 5,981,268 A | 11/1999 | Kovacs et al. |
| 5,982,166 A | 11/1999 | Mautz |
| 5,993,611 A | 11/1999 | Moroney, III et al. |
| 5,995,914 A | 11/1999 | Cabot |
| 5,996,102 A | 11/1999 | Haulin |
| 5,998,768 A | 12/1999 | Hunter et al. |
| 5,999,268 A | 12/1999 | Yonezawa et al. |
| 6,001,760 A | 12/1999 | Katsuda et al. |
| 6,002,236 A | 12/1999 | Trant et al. |
| 6,002,263 A | 12/1999 | Peters et al. |
| 6,002,426 A | 12/1999 | Back et al. |
| 6,013,586 A | 1/2000 | McGhee et al. |
| 6,019,612 A | 2/2000 | Hasegawa et al. |
| 6,023,209 A | 2/2000 | Faulkner et al. |
| 6,028,435 A | 2/2000 | Nikawa |
| 6,029,141 A | 2/2000 | Bezos et al. |
| 6,031,383 A | 2/2000 | Streib et al. |
| 6,032,714 A | 3/2000 | Fenton |
| 6,034,533 A | 3/2000 | Tervo et al. |
| 6,037,785 A | 3/2000 | Higgins |
| 6,037,793 A | 3/2000 | Miyazawa et al. |
| 6,043,667 A | 3/2000 | Cadwallader et al. |
| 6,043,668 A | 3/2000 | Carney |
| 6,049,216 A | 4/2000 | Yang et al. |

| | | | | | | |
|---|---|---|---|---|---|---|
| 6,051,422 | A | 4/2000 | Kovacs et al. | 6,307,672 B1 | 10/2001 | DeNure |
| 6,052,653 | A | 4/2000 | Mazur et al. | 6,310,483 B1 | 10/2001 | Taura et al. |
| 6,054,869 | A | 4/2000 | Hutton et al. | 6,310,755 B1 | 10/2001 | Kholodenko et al. |
| 6,060,888 | A | 5/2000 | Blackham et al. | 6,313,567 B1 | 11/2001 | Maltabes et al. |
| 6,060,891 | A | 5/2000 | Hembree et al. | 6,313,649 B2 | 11/2001 | Harwood et al. |
| 6,060,892 | A | 5/2000 | Yamagata | 6,320,372 B1 | 11/2001 | Keller |
| 6,061,589 | A | 5/2000 | Bridges et al. | 6,320,396 B1 | 11/2001 | Nikawa |
| 6,064,213 | A | 5/2000 | Khandros et al. | 6,327,034 B1 | 12/2001 | Hoover et al. |
| 6,064,217 | A | 5/2000 | Smith | 6,335,625 B1 | 1/2002 | Bryant et al. |
| 6,064,218 | A | 5/2000 | Godfrey et al. | 6,335,628 B2 | 1/2002 | Schwindt et al. |
| 6,066,911 | A | 5/2000 | Lindemann et al. | 6,340,568 B2 | 1/2002 | Hefti |
| 6,078,183 | A | 6/2000 | Cole, Jr. | 6,340,895 B1 | 1/2002 | Uher et al. |
| 6,091,236 | A | 7/2000 | Piety et al. | 6,359,456 B1 | 3/2002 | Hembree et al. |
| 6,091,255 | A | 7/2000 | Godfrey | 6,362,636 B1 | 3/2002 | Peters et al. |
| 6,096,567 | A | 8/2000 | Kaplan et al. | 6,362,792 B1 | 3/2002 | Sawamura et al. |
| 6,100,815 | A | 8/2000 | Pailthorp | 6,366,247 B1 | 4/2002 | Sawamura et al. |
| 6,104,203 | A | 8/2000 | Costello et al. | 6,369,776 B1 | 4/2002 | Leisten et al. |
| 6,104,206 | A | 8/2000 | Verkuil | 6,376,258 B2 | 4/2002 | Hefti |
| 6,111,419 | A | 8/2000 | Lefever et al. | 6,380,751 B2 | 4/2002 | Harwood et al. |
| 6,114,865 | A | 9/2000 | Lagowski et al. | 6,384,614 B1 | 5/2002 | Hager et al. |
| 6,118,287 | A | 9/2000 | Boll et al. | 6,395,480 B1 | 5/2002 | Hefti |
| 6,118,894 | A | 9/2000 | Schwartz et al. | 6,396,296 B1 | 5/2002 | Tarter et al. |
| 6,121,783 | A | 9/2000 | Horner et al. | 6,396,298 B1 | 5/2002 | Young et al. |
| 6,124,723 | A | 9/2000 | Costello | 6,400,168 B2 | 6/2002 | Matsunaga et al. |
| 6,124,725 | A | 9/2000 | Sato | 6,404,213 B2 | 6/2002 | Noda |
| 6,127,831 | A | 10/2000 | Khoury et al. | 6,407,560 B1 | 6/2002 | Walraven et al. |
| 6,130,544 | A | 10/2000 | Strid et al. | 6,407,562 B1 | 6/2002 | Whiteman |
| 6,137,302 | A | 10/2000 | Schwindt | 6,409,724 B1 | 6/2002 | Penny et al. |
| 6,137,303 | A | 10/2000 | Deckert et al. | 6,414,478 B1 | 7/2002 | Suzuki |
| 6,144,212 | A | 11/2000 | Mizuta | 6,415,858 B1 | 7/2002 | Getchel et al. |
| 6,147,502 | A | 11/2000 | Fryer et al. | 6,418,009 B1 | 7/2002 | Brunette |
| 6,147,851 | A | 11/2000 | Anderson | 6,420,722 B2 | 7/2002 | Moore et al. |
| 6,160,407 | A | 12/2000 | Nikawa | 6,424,141 B1 | 7/2002 | Hollman et al. |
| 6,161,294 | A | 12/2000 | Bland et al. | 6,424,316 B1 | 7/2002 | Leisten et al. |
| 6,166,553 | A | 12/2000 | Sinsheimer | 6,445,202 B1 | 9/2002 | Cowan et al. |
| 6,169,410 | B1 | 1/2001 | Grace et al. | 6,447,339 B1 | 9/2002 | Reed et al. |
| 6,172,337 | B1 | 1/2001 | Johnsgard et al. | 6,448,788 B1 | 9/2002 | Meaney et al. |
| 6,175,228 | B1 | 1/2001 | Zamborelli et al. | 6,459,739 B1 | 10/2002 | Vitenberg |
| 6,181,144 | B1 | 1/2001 | Hembree et al. | 6,466,046 B1 | 10/2002 | Maruyama et al. |
| 6,181,149 | B1 | 1/2001 | Godfrey et al. | 6,468,816 B2 | 10/2002 | Hunter |
| 6,181,297 | B1 | 1/2001 | Leisten | 6,476,442 B1 | 11/2002 | Williams et al. |
| 6,181,416 | B1 | 1/2001 | Falk | 6,480,013 B1 | 11/2002 | Nayler et al. |
| 6,184,845 | B1 | 2/2001 | Leisten et al. | 6,481,939 B1 | 11/2002 | Gillespie et al. |
| 6,191,596 | B1 | 2/2001 | Abiko | 6,483,327 B1 | 11/2002 | Bruce et al. |
| 6,194,720 | B1 | 2/2001 | Li et al. | 6,483,336 B1 | 11/2002 | Harris et al. |
| 6,194,907 | B1 | 2/2001 | Kanao et al. | 6,486,687 B2 | 11/2002 | Harwood et al. |
| 6,198,299 | B1 | 3/2001 | Hollman | 6,488,405 B1 | 12/2002 | Eppes et al. |
| 6,211,663 | B1 | 4/2001 | Moulthrop et al. | 6,489,789 B2 | 12/2002 | Peters et al. |
| 6,211,837 | B1 | 4/2001 | Crouch et al. | 6,490,471 B2 | 12/2002 | Svenson et al. |
| 6,215,295 | B1 | 4/2001 | Smith, III | 6,492,822 B2 | 12/2002 | Schwindt et al. |
| 6,222,031 | B1 | 4/2001 | Wakabayashi et al. | 6,501,289 B1 | 12/2002 | Takekoshi |
| 6,222,970 | B1 | 4/2001 | Wach et al. | 6,512,391 B2 | 1/2003 | Cowan et al. |
| 6,229,322 | B1 | 5/2001 | Hembree | 6,512,482 B1 | 1/2003 | Nelson et al. |
| 6,229,327 | B1 | 5/2001 | Boll et al. | 6,515,494 B1 | 2/2003 | Low |
| 6,232,787 | B1 | 5/2001 | Lo et al. | 6,528,993 B1 | 3/2003 | Shin et al. |
| 6,232,788 | B1 | 5/2001 | Schwindt et al. | 6,529,844 B1 | 3/2003 | Kapetanic et al. |
| 6,232,789 | B1 | 5/2001 | Schwindt | 6,548,311 B1 | 4/2003 | Knoll |
| 6,232,790 | B1 | 5/2001 | Bryan et al. | 6,549,022 B1 | 4/2003 | Cole, Jr. et al. |
| 6,233,613 | B1 | 5/2001 | Walker et al. | 6,549,026 B1 | 4/2003 | Dibattista et al. |
| 6,236,223 | B1 | 5/2001 | Brady et al. | 6,549,106 B2 | 4/2003 | Martin |
| 6,236,975 | B1 | 5/2001 | Boe et al. | 6,566,079 B2 | 5/2003 | Hefti |
| 6,236,977 | B1 | 5/2001 | Verba et al. | 6,573,702 B2 | 6/2003 | Marcuse et al. |
| 6,242,929 | B1 | 6/2001 | Mizuta | 6,578,264 B1 | 6/2003 | Gleason et al. |
| 6,245,692 | B1 | 6/2001 | Pearce et al. | 6,580,283 B1 | 6/2003 | Carbone et al. |
| 6,251,595 | B1 | 6/2001 | Gordon et al. | 6,582,979 B2 | 6/2003 | Coccioli et al. |
| 6,252,392 | B1 | 6/2001 | Peters | 6,587,327 B1 | 7/2003 | Devoe et al. |
| 6,257,319 | B1 | 7/2001 | Kainuma et al. | 6,603,322 B1 | 8/2003 | Boll et al. |
| 6,257,564 | B1 | 7/2001 | Avneri et al. | 6,605,951 B1 | 8/2003 | Cowan |
| 6,259,261 | B1 | 7/2001 | Engelking et al. | 6,605,955 B1 | 8/2003 | Costello et al. |
| 6,265,950 | B1 | 7/2001 | Schmidt et al. | 6,608,494 B1 | 8/2003 | Bruce et al. |
| 6,271,673 | B1 | 8/2001 | Furuta et al. | 6,608,496 B1 | 8/2003 | Strid et al. |
| 6,275,738 | B1 | 8/2001 | Kasevich et al. | 6,611,417 B2 | 8/2003 | Chen |
| 6,278,051 | B1 | 8/2001 | Peabody | 6,617,862 B1 | 9/2003 | Bruce |
| 6,278,411 | B1 | 8/2001 | Ohlsson et al. | 6,621,082 B2 | 9/2003 | Morita et al. |
| 6,281,691 | B1 | 8/2001 | Matsunaga et al. | 6,624,891 B2 | 9/2003 | Marcus et al. |
| 6,284,971 | B1 | 9/2001 | Atalar et al. | 6,627,461 B2 | 9/2003 | Chapman et al. |
| 6,288,557 | B1 | 9/2001 | Peters et al. | 6,628,503 B2 | 9/2003 | Sogard |
| 6,292,760 | B1 | 9/2001 | Burns | 6,628,980 B2 | 9/2003 | Atalar et al. |
| 6,300,775 | B1 | 10/2001 | Peach et al. | 6,633,174 B1 | 10/2003 | Satya et al. |

| | | |
|---|---|---|
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,650,135 B1 | 11/2003 | Mautz et al. |
| 6,653,903 B2 | 11/2003 | Leich et al. |
| 6,657,214 B1 | 12/2003 | Foegelle et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,803,779 B2 | 10/2004 | Strid |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,423 B2 | 7/2005 | Nordgren et al. |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,965,226 B2 | 11/2005 | Dunklee |
| 6,970,001 B2 | 11/2005 | Chheda et al. |
| 6,980,012 B2 | 12/2005 | Schwindt |
| 6,987,398 B2 | 1/2006 | Strid et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,138,810 B2 | 11/2006 | Lesher |
| 7,138,813 B2 | 11/2006 | Cowan et al. |
| 7,164,279 B2 | 1/2007 | Strid et al. |
| 7,176,705 B2 | 2/2007 | Rumbaugh |
| 7,187,188 B2 | 3/2007 | Andrews et al. |
| 7,188,037 B2 | 3/2007 | Hidehira |
| 7,190,181 B2 | 3/2007 | Peters et al. |
| 7,221,146 B2 | 5/2007 | Dunklee |
| 7,221,172 B2 | 5/2007 | Dunklee |
| 7,250,626 B2 | 7/2007 | Lesher |
| 7,250,752 B2 | 7/2007 | Peters et al. |
| 7,250,779 B2 | 7/2007 | Dunklee et al. |
| 7,262,626 B2 * | 8/2007 | Iwasaki ............... 324/754.1 |
| 7,268,533 B2 | 9/2007 | Harris et al. |
| 7,292,057 B2 | 11/2007 | Cowan |
| 7,295,025 B2 | 11/2007 | Lesher |
| 7,321,233 B2 | 1/2008 | Strid et al. |
| 7,330,023 B2 | 2/2008 | Schwindt et al. |
| 7,330,041 B2 | 2/2008 | McFadden |
| 7,348,787 B2 | 3/2008 | Harwood et al. |
| 7,352,168 B2 | 4/2008 | Dunklee |
| 7,362,115 B2 | 4/2008 | Andrews et al. |
| 7,368,925 B2 | 5/2008 | Navratil et al. |
| 7,388,366 B2 * | 6/2008 | Goeke ............... 324/755.02 |
| 7,423,419 B2 | 9/2008 | Dunklee |
| 7,436,170 B2 | 10/2008 | Peters et al. |
| 7,468,609 B2 | 12/2008 | Dunklee |
| 7,492,147 B2 | 2/2009 | Schwindt et al. |
| 7,492,172 B2 | 2/2009 | Stewart et al. |
| 7,498,828 B2 | 3/2009 | Dunklee et al. |
| 7,501,810 B2 | 3/2009 | Dunklee |
| 7,504,823 B2 | 3/2009 | Rumbaugh |
| 7,514,915 B2 | 4/2009 | Dunklee |

| Patent Number | Date | Name |
|---|---|---|
| 7,518,358 B2 | 4/2009 | Dunklee |
| 7,550,984 B2 | 6/2009 | Lesher et al. |
| 7,554,322 B2 | 6/2009 | Nordgren et al. |
| 7,589,518 B2 | 9/2009 | Schwindt et al. |
| 7,595,632 B2 | 9/2009 | Harwood et al. |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gunderson et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0123994 A1* | 7/2004 | Hohenwater et al. ............ 174/36 |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0127927 A1 | 6/2005 | Harris |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237079 A1* | 10/2005 | Tanida et al. ................. 324/765 |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0194778 A1 | 8/2007 | Dunklee et al. |
| 2007/0273387 A1 | 11/2007 | Harris et al. |
| 2007/0294047 A1 | 12/2007 | Hayden |
| 2008/0012578 A1 | 1/2008 | Campbell |
| 2008/0042374 A1 | 2/2008 | Dunklee |
| 2008/0042376 A1 | 2/2008 | Nordgren et al. |
| 2008/0042642 A1 | 2/2008 | Dunklee |
| 2008/0042669 A1 | 2/2008 | Nordgren et al. |
| 2008/0042670 A1 | 2/2008 | Nordgren et al. |
| 2008/0042675 A1 | 2/2008 | Navratil et al. |
| 2008/0042680 A1 | 2/2008 | Cowan et al. |
| 2008/0048693 A1 | 2/2008 | Peters et al. |
| 2008/0054884 A1 | 3/2008 | Dunklee |
| 2008/0054885 A1 | 3/2008 | Dunklee |
| 2008/0157796 A1 | 7/2008 | Andrews et al. |
| 2008/0218187 A1 | 9/2008 | Lesher |
| 2009/0153167 A1 | 6/2009 | Stewart et al. |

FOREIGN PATENT DOCUMENTS

| | | |
|---|---|---|
| DE | 2912826 | 10/1980 |
| DE | 3114466 | 3/1982 |
| DE | 3125552 | 11/1982 |
| DE | 3637549 | 5/1988 |
| DE | 288 234 | 3/1991 |
| DE | 4109908 | 10/1992 |
| DE | 4316111 | 11/1994 |
| DE | 9406227 | 8/1995 |
| DE | 19541334 | 9/1996 |
| DE | 19616212 | 10/1996 |
| DE | 19522774 | 1/1997 |
| DE | 19618717 | 1/1998 |
| DE | 69322206 | 4/1999 |
| DE | 10000324 | 7/2001 |
| EP | 0087497 | 9/1983 |
| EP | 0201205 | 12/1986 |
| EP | 0314481 | 5/1989 |
| EP | 0333521 | 9/1989 |
| EP | 0460911 | 12/1991 |
| EP | 0574149 | 12/1993 |
| EP | 0706210 | 4/1996 |
| EP | 0505981 | 6/1998 |
| EP | 0573183 | 1/1999 |
| EP | 0945736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |

| | | |
|---|---|---|
| JP | 56-88333 | 7/1981 |
| JP | 57-075480 | 5/1982 |
| JP | 57-163035 | 10/1982 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-022837 | 1/1990 |
| JP | 2-022873 | 1/1990 |
| JP | 2-124469 | 5/1990 |
| JP | 2-191352 | 7/1990 |
| JP | 2-220453 | 9/1990 |
| JP | 3-067187 | 3/1991 |
| JP | 3-175367 | 7/1991 |
| JP | 3-196206 | 8/1991 |
| JP | 03-228348 | 10/1991 |
| JP | 4-000732 | 1/1992 |
| JP | 04-130639 | 5/1992 |
| JP | 04-159043 | 6/1992 |
| JP | 04-206930 | 7/1992 |
| JP | 4-340248 | 11/1992 |
| JP | 5-008476 | 1/1993 |
| JP | 05-082631 | 4/1993 |
| JP | 5-157790 | 6/1993 |
| JP | 5-166893 | 7/1993 |
| JP | 6-085044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-005197 | 1/1995 |
| JP | 7-12871 | 1/1995 |
| JP | 7-084003 | 3/1995 |
| JP | 7-273509 | 10/1995 |
| JP | 8-35987 | 2/1996 |
| JP | 8-261898 | 10/1996 |
| JP | 08-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Aebersold, R. and Mann, M., "Mass Spectrometry-Based Proteomics," Nature, vol. 422, pp. 198-207, (Mar. 13, 2003).
Afsar, M.N., et al., "The Measurement of the Properties of Materials," Proceedings of the IEEE, vol. 74, No. 1, pp. 183-199, (Jan. 1986).
Applebay Exhibit 572, "Manual Wafer Test Chamber with Probe/Optics Assembly Raised for Access", (May 13, 1998), 2 pages.
Applebay Exhibit 578, "Flexion Cryotest Station", (May 13, 1998), 1 page.
Applebay Exhibits 577A, 577B, 577C, (May 13, 1998), 3 pages.
Applebay Exhibits 581A, 581B, and 581C, (May 13, 1998), 3 pages.
Basu, S. and Hayden, L, "An SOLR Calibration for Accurate Measurement of Orthogonal On-Wafer DUTS," IEEE MTT-S Digest, pp. 1335-1338, (1997, month unavailable).
Bauer, R.F., et al. "De-Embedding and Unterminating," IEEE Transactions on Microwave Theory and Techniques, vol. MTT-22, No. 3, (Mar. 1974), pp. 282-288.
Beck, S. and Tomann, E., "Chip Tester," IBM Technical Disclosure Bulletin, (Jan. 1985).
Boguski, M.S. and McIntosh, M.W., "Biomedical informatics for Proteomics," Insight: review article, Nature 422, pp. 233-237 (Mar. 13, 2003).
Browne, J., "Integrated System Tests Device Flicker Noise", (Jul. 2008), [online], [retrieved on Feb. 15, 2010], Retrieved from the Microwaves and RF web site using Internet, <URL: http://www.mwrf.com/Articles/Index.cfm?Ad=1&ArticleID=19392>.
Cascade Microtech Technical Brief, "A Guide to Better Vector Network Analyzer Calibrations for Probe-Tip Measurements", 2 pages, (Copyright 1994).
Cascade Microtech, "Analytical Probe Station," Summit 9000 Series, (Jun. 1, 1990).
Cascade Microtech, "Introducing the Peak of Analytical Probe Stations," MicroProbe Update, (May 1990).
Cascade Microtech, "Model 42/42D Microwave Probe Station" Instruction Manual, pp. 4-1-4-42, (Copyright 1987).
Cascade Microtech, "Probe Heads Care and cleaning of coaxial input microwave probes," Microwave Probe Care and Cleaning, Instruction Manual, Copyright 1990.
Clifton, B.J., "Precision slotted-Line Impedance Measurements Using computer Simulation for Data Correction," IEEE Transactions on Instrumentation and Measurement, vol. IM-19, No. 4, pp. 358-363, (Nov. 1970).
Cole, K., "ThermoChuck Performance", (Fax), 2 pages, (Mar. 10, 1995).
Cross Section—Signatone S-1240 Sketch, Advertised & Sold (1987-1988).
Design Technique International, "Adjustable Test Fixture," 2 pages, (Copyright 1988).
Design Technique, "Microstrip Microwave Test Fixture," 2 pages, (May 1986).
Fitzpatrick, J., "Error Models for Systems Measurement," Microwave Journal, pp. 63-66, (May 1978).
Flexion Corporation, "AP—4 Cryotest Station", Applebay Exhibit 585, (May 13, 1998), 7 pages.
Flexion Corporation, "AP—1 Cryotest Station User Manual," Applebay Exhibit 583, (May 13, 1998), 187 pages.
Flexion Corporation, "AP—1 Cryotest Station," Applebay Exhibit 582, (May 13, 1998), 20 pages.
Flexion Corporation, "Cryotest Station MP—3," Applebay Exhibit 576, (May 13, 1998), 62 pages.
Grober, R.D., et al., "Optical antenna: towards a unity efficiency near-field optical probe," Appl. Phys. Lett. 70 (11), American Insitute of Physics, pp. 1354-1356, (Mar. 17, 1997).
Hanash, S., "Disease Proteomics," Nature, vol. 422, pp. 226-232, (Mar. 13, 2003).
Hansen, M., "Achieving Accurate On-Wafter Flicker Noise Measurements through 30 MHz", Cascade Microtech, Inc., (May 2009).
Hayden, L., "A Multi-Line TRL Calibration," 5 pages, (Feb. 2, 1994).
Hewlett Packard, "HP 4142B Modular DC source/Monitor Practical Applications—High Speed DC Characterization of Semiconductor Devices from Sub pA to 1A," (Nov. 1987), pp. 1-4.
Hewlett Packard, "HP 4284A Precision LCR Meter Operation Manual (Including Option 001,002,006,201,202,301)," Third Edition, pp. 2-1, 6-9, 6-15, (Dec. 1991).
Hoer, C.A., "A High-Power Dual Six-Port Automatic Network Analyzer Used in Determining Biological Effects of RF and Microwave Radiation," IEEE Transactions on Microwave Theory and Techniques, vol. MTT-29, No. 12, (Dec. 1981).

Keithley Instruments, Inc. "Low-Level Measurements for Effective Low Current, Low Voltage, and High Impedance Measurements," Revised Third Edition, (Copyright 1984).

Knauer, W., "Fixturing for Low-Current/Low-Voltage Parametric Testing," Evaluation Engineering, pp. 9-12, (Nov. 1990).

Koyama, R.Y. and Buehler, M.G., "Semiconductor Measurement Technology: A Wafer Chuck for Use Between −196 and 350° C.", *Center for Electronics and Electrical Engineering*, U.S. Department of Congress, (Issued Jan. 1979).

Kraszewski, A.W., et al., "Use of a Microwave Cavity for Sensing Dielectric Properties of Arbitrarily Shaped Biological Objects," IEEE Transactions on Microwave Theory and Techniques, vol. 38, No. 7, pp. 858-863, (Jul. 1990).

Liang, Q., et al., "Accurate ac Transistor Characterization to 110 GHz Using a New Four-port Self-Calibrated Extraction Technique," IEEE, Topical Meeting on Silicon Monolithic Integrated Circuits in RF Systems, pp. 282-285, (2004, month unavailable).

Maury Microwave Corporation, MT950 Series Transistor Test Fixture (TTF), 4 pages, (Oct. 7, 1982).

Maury Microwave Corporation, "MT950D Series, Transistor Test Fixture Software, Software Application Packs", (Sep. 20, 1982).

Micromanipulator Sales and Services Inc., "Test Station Accessories," 1 page, (Copyright 1983, 1984).

Microwave Products, Microwave Journal, (Sep. 1988), 1 page.

Modolo, J.A., et al., "Wafer level high-frequency measurements of photodetector characteristics," Applied Optics, vol. 27, No. 15, pp. 3059-3060, (Aug. 1, 1988).

Phizicky, E., et al., "Protein Analysis on a Proteomic Scale", Nature 422, pp. 208-215 (Mar. 13, 2003).

Photo: Micromanipulator Probe Station (1994).

Purroy, F. and Pradell, Lluis, "New Theoretical Analysis of the LRRM Calibration Technique for Vector Network Analyzers", IEEE Transactions on Instrumentation and Measurement, vol. 50, No. 5, pp. 1307-1313, (Oct. 2001).

Risacher, C., et al., "Wavequide-to-Microstrip Transition With Integrated Bias-T," IEEE Microwave and Wireless Components Letters, vol. 13. No. 7, pp. 262-264, (Jul. 2003).

Rosu, I., "Understanding Noise Figure", YO3DAC/VA3IUL, [online], [retrieved on Feb. 15, 2010], <URL: http://www.gsl.net/va3iul/Noise/noise.html>.

Sali, A., et al., "From Words to Literature in Structural Proteomics," Nature 422, pp. 216-225 (Mar. 13, 2003).

Seguinot, C., et al., "Multimode TRL—A New concept in Microwave Measurements: Theory and Experimental Verification," IEEE Transactions on Microwave Theory and Techniques, vol. 46, No. 5, pp. 536-542, (May 1998).

Singer, P., "New Tool Takes on Flicker Noise", [online], [retrieved on Nov. 14, 2008], Retrieved from the Solid State Technology web site using Internet, <URL: http://www.electroiq.com/index/display/semiconductors-article-display/329125/articles/solid-state-technology/semiconductors/inspection/2008/05/new-tool-takes-on-flicker-noise.html>.

Sohn, L.L., et al., "Capacitance Cytometry: Measuring Biological Cells One by One," PNAS vol. 97, No. 20 pp. 10687-10690, (Sep. 26, 2000).

Strid, E., "Planar Impedance Standards and Accuracy Considerations in Vector Network Analysis," Cascade Microtech, Inc., 8 pages, (Jun. 1986).

Temptronic, "Guarded" Chuck Sketch, (Nov. 15, 1989).

The Micromanipulator Company, Inc., "Model 8000 Test Station," (1986), 1 page, (date unavailable).

The Micromanipulator Company, Inc., "Model 8000 Test Station," (1988), 1 page, (date unavailable).

Tompkins, J.D., "Evaluating High Speed AC Testers," IBM Technical Disclosure Bulletin, vol. 13, No. 7, p. 180, (Dec. 1970).

Tyers, M. and Mann, M., "From Genomics to Proteomics," Nature, vol. 422, pp. 193-197, (Mar. 13, 2003).

Venkatesh, M.S. and Raghaven, G.S.V., "An overview of dielectric properties measuring techniques," Canadian Biosystems Engineering, vol. 47, pp. 7.15-7.30, (2005, month unavailable).

Xu, D., et al., "Measurement of the Dielectric Properties of Biological Substances Using an Improved Open-Ended Coaxial Line Resonator Method," IEEE Transactions on Microwave Theory and Techniques, vol. MTT-35, No. 12, pp. 1424-1428, (Dec. 1987).

Yamamoto, Y., "A Compact Self-Shielding Prober for Accurate Measurement of On-Wafer Electron Devices," IEEE Transactions on Instrumentation and Measurement, vol. 38, No. 6, pp. 1088-1093, (Dec. 1989).

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics." Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions on Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

Y. Koyama & M. G. Buehler, "Semiconductor Measurement Technology. A Wafer Chuck for Use Between −196 and 350° C.," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68$^{th}$ Street, Mercer Island, Washington 98040.

The Micromanipulator Company, Inc., "Model 8000 Test Station," 1986, 1 page.

The Micromanipulator Company, Inc. "Model 8000 Test Station," 1988, 1 page.

Microwave Products, Microwave Journal, Sep. 1988, 1 page.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," Cascade Microtech, Inc. vs. Micromanipulator Company, Inc., Applebay Exhibit 576, May 13, 1998, 68 pages.

Flexion Corporation, "Cryotest Station MP-3," Cascade Microtech, Inc. vs. Micromanipulator Company, Inc., Applebay Exhibit 578, May 13, 1998, 1 page.

Cascade Microtech, Inc. vs. Micromanipulator Company, Inc., Applebay Exhibit 572, May 13, 1998, 2 pages.

Cascade Microtech, Inc. vs. Micromanipulator Company, Inc., Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

Cascade Microtech, Inc. vs. Micromanipulator Company, Inc., Applebay Exhibits 577A, 577B, 577C, May 13, 1998, 3 pages.

Cascade Microtech, Inc. vs. Micromanipulator Company, Inc., Applebay Exhibit 585, May 13, 1998, 7 pages.

\* cited by examiner

TEST APPARATUS FOR MEASURING A CHARACTERISTIC OF A DEVICE UNDER TEST

CROSS-REFERENCE TO RELATED APPLICATIONS

This application claims the benefit of U.S. Provisional Application No. 61/200,187, filed Nov. 24, 2008.

BACKGROUND OF THE INVENTION

The present invention is directed to probe equipment for low noise measurements.

It is sometimes desirable to determine the functional characteristics and/or the performance of an electrical device, such as an integrated circuit. One of the performance characteristics of interest for an electrical device is the noise level of the device itself or a combination of devices. The noise contribution of each device in a signal path should be sufficiently low that collectively they do not interfere with the ability to detect the signals. Typically, the level of the noise is referred to as the signal to noise ratio of the device. In some cases, the level of the noise is relative to a known potential, such as ground.

The level of the noise of a device, such as the noise observed at the collector or drain of a device, is used to describe the characteristics of the device or collection of devices. For example, an ideal amplifier would produce no noise of its own, but simply amplify the input to an output level. By way of example, a 10 dB amplifier would amplify the signal, including any noise included therein, at its input by 10 dB. Therefore, although the noise would be 10 dB higher at the output of the amplifier, the overall signal to noise ratio would remain unchanged. However, the device itself may produce additional noise, that when added to the input noise, results in a decrease in the signal-to-noise ratio. Accordingly, to lower the overall noise levels it is desirable to reduce the amount of noise added by the device itself.

Thermal noise, generally referred to as Johnson noise, is generated by the thermal agitation of electrons in a conductive material. In general, this noise is produced by the thermal agitation of the charges in an electrical conductor and is proportional to the absolute temperature of the conductor. It tends to manifest itself in the input circuits of devices such as amplifiers where the signal levels are low. The thermal noise level tends to limit the minimum noise that a circuit can attain at a given temperature. The thermal noise tends to be relatively uniform throughout the frequency spectrum and depends on k (Boltzman constant) and T (temperature in degrees Kelvin).

Shot noise is typically generated where there is a potential barrier (voltage differential). One example of such a potential barrier is a p-type/n-type junction diode. Shot noise is generated when the electrons and holes cross the barrier. On the other hand, a resistor normally does not produce shot noise since there is no potential barrier within a resistor. Current flowing through a resistor does not typically exhibit such fluctuations. However, current flowing through a diode and similar devices produces small signal fluctuations. This is due to electrons (in turn, the charge) arriving in quanta, one electron at a time. Thus, the current flow is not continuous, but limited by the quantum of the electron charges.

1/f (one-over-f) noise, generally referred to as flicker noise, is found in many natural phenomena such as nuclear radiation, electron flow through a conductor, or even in the environment. Flicker noise is associated with crystal surface defects in semiconductors. The noise power tends to be proportional to the bias current and, unlike thermal noise and shot noise, flicker noise decreases with frequency. An exact mathematical model for flicker noise does not exist because it tends to be device specific. However, flicker noise tends to exhibit an inverse proportionality with frequency that is generally 1/f for low frequencies. Flicker noise tends to be essentially random in nature, but, because its frequency spectrum is not flat, it is not considered a true white noise. In general, flicker noise tends to have the characteristic that the longer the time spent measuring flicker noise, the greater the fluctuation in the measurements. Likewise, the less the time spent measuring flicker noise, the less the fluctuation in the measurements. Time is related to 1/frequency, so this flicker noise has been named 1/f noise Flicker noise tends to be more prominent in FETs, and bulk carbon resistors. Flicker noise is present in many other types of devices, including for example, MOSFETs, CMOS, bipolar junction transistors, and inductors. Flicker noise may be characterized by a corner frequency FL, which is the point where the flicker noise is generally equal to white noise. Referring to FIGS. 1, 2, and 3, graphs of flicker noise over frequency is shown, together with the corner frequency FL.

Flicker noise becomes more pronounced with smaller device geometries and lower operating voltages. For higher frequency, lower voltage digital circuits with higher data rates flicker noise is a dominant cause of logic errors increasing the importance of accurate measurements of flicker noise. Flicker noise increases as the size of devices decreases and as the flicker noise increases so does the flicker noise bandwidth. While in the past flicker noise testing was done in the KHz frequency region, smaller devices producing increased flicker noise make it desirable that the flicker noise test system be capable of measuring the flicker noise at frequencies up to generally 30 MHz to more fully characterize the flicker noise spectrum. The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 5A is a partial top view of the wafer probe station of FIG. 4 with the enclosure door shown partially open.
FIG. 6A is an enlarged sectional view taken along line 6A-6A of FIG. 6.

DETAILED DESCRIPTION OF PREFERRED EMBODIMENT

Flicker noise increases as the size of a device decreases and an increase in flicker noise increases the flicker noise bandwidth, the measurement range required to fully characterize the flicker noise. Characterizing the flicker noise of smaller devices requires measurement system components with a good frequency response, elimination or control of electrical noise that might affect the system and accurate DC measurements for the device under test.

Integrated circuits (ICs) include micro-circuits chemically etched on and into semiconductor material or wafers. It is customary to manufacture several ICs on a single wafer and then separate the individual circuits after performance and functional testing in a wafer probe station. The test points on ICs are customarily laid out along rectangular grid coordinates and may be tested with multiple probes on a probe card or by single probes in a north-south-east-west arrangement. Likewise, ICs in a composite device are typically arranged along rectangular coordinates. It is desirable to measure flicker noise for multiple devices on a wafer to obtain sufficient data to establish statistical significance and to observe the variation in flicker noise at different sites on the wafer. Probe stations are also used for testing the performance and function of an IC both before and after the IC has been incorporated into a composite device.

Figure 4:
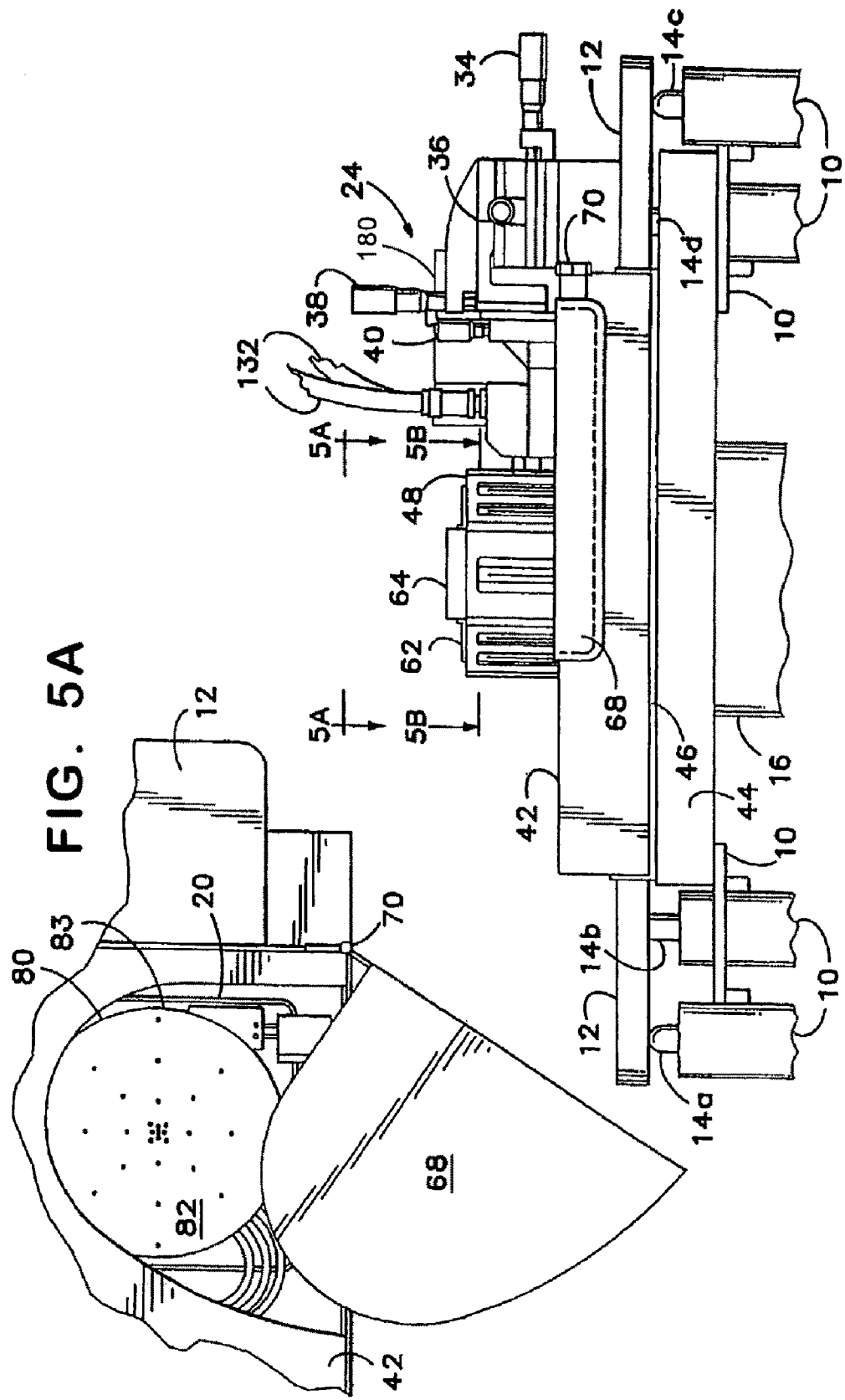
FIG. 4 is a partial front view of an exemplary embodiment of a wafer probe station constructed in accordance with the present invention.
Figure 5:
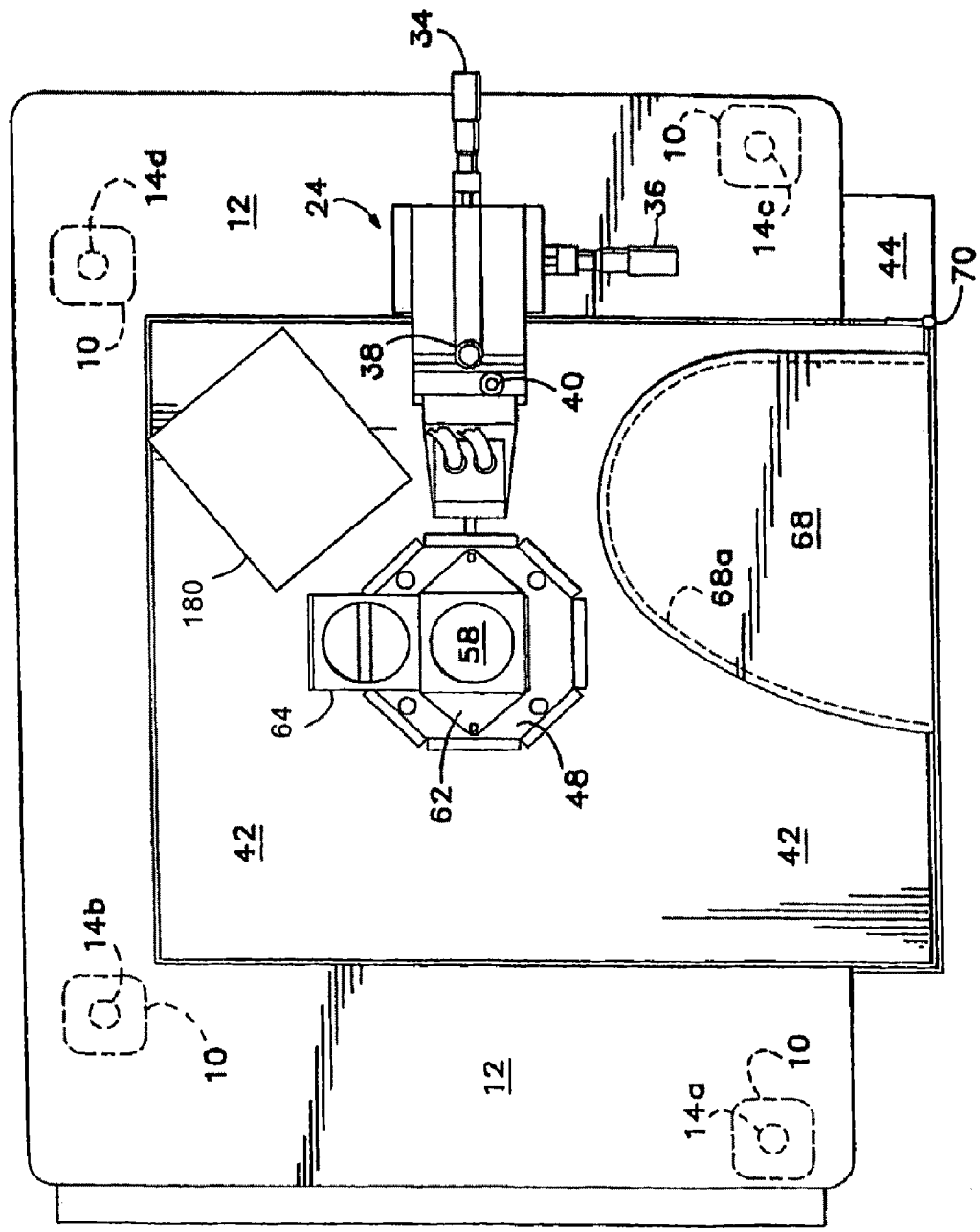
FIG. 5 is a top view of the wafer probe station of FIG. 4.
Figure 6:
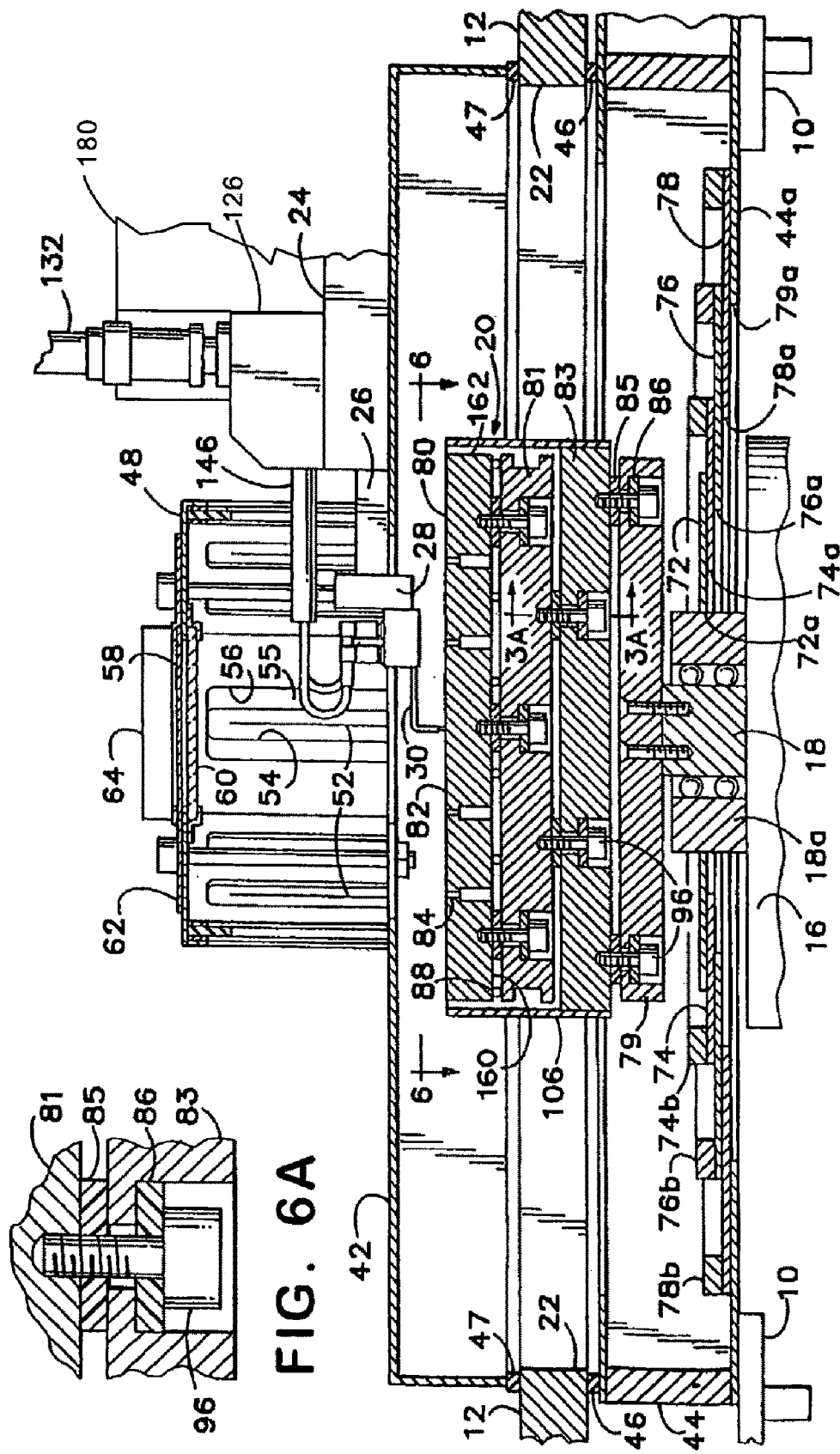
FIG. 6 is a partially sectional and partially schematic front view of the probe station of FIG. 4.

With reference to FIGS. 4, 5 and 6, an exemplary embodiment of a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other device under test (DUT). The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

Unwanted electrical noise is a major obstacle in the measurement of flicker noise. Noise can originate from many sources and the probe station typically includes an environmental control enclosure to provide a test environment that is isolated from noise. An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 8A:
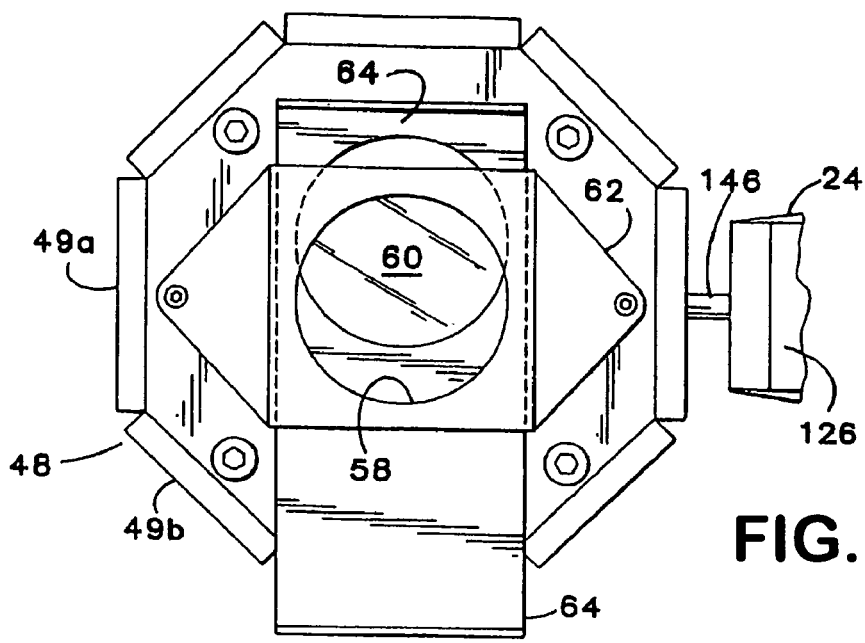
FIG. 8A is an enlarged top detail view taken along line 8A-8A of FIG. 4.
Figure 8B:
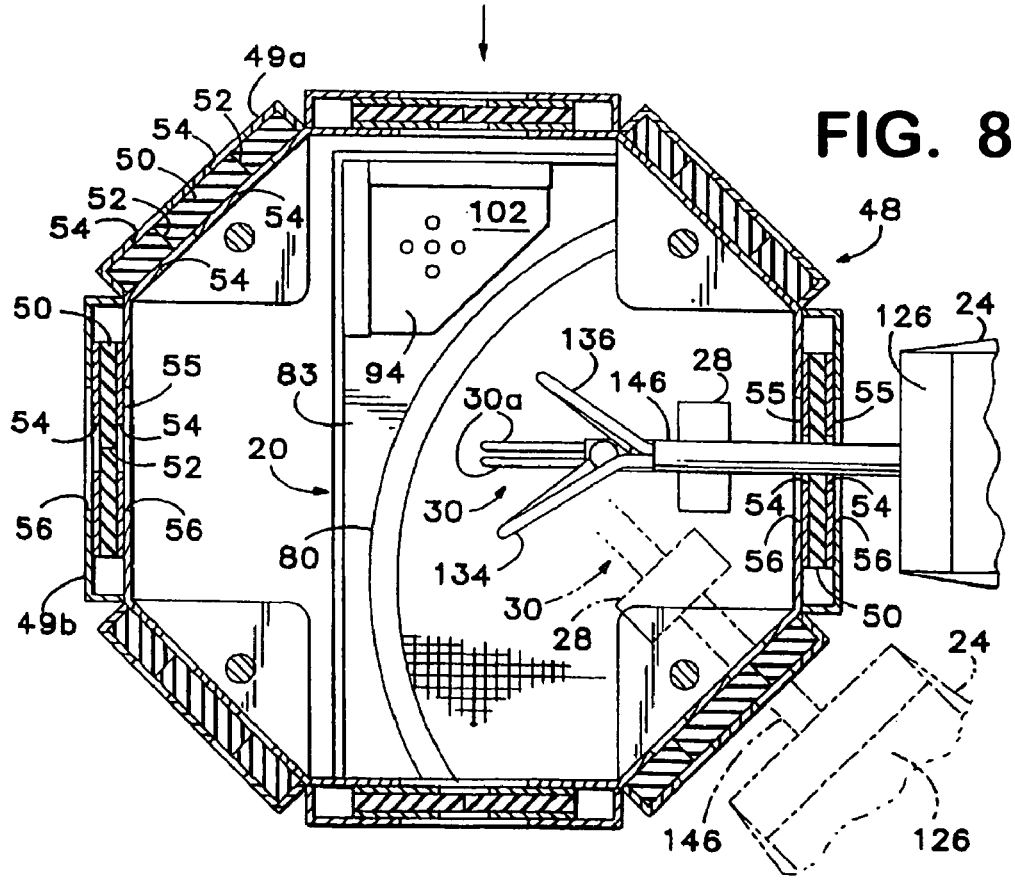
FIG. 8B is an enlarged top sectional view taken along line 8B-8B of FIG. 4.

With reference to FIGS. 8A and 8B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

Figure 1:
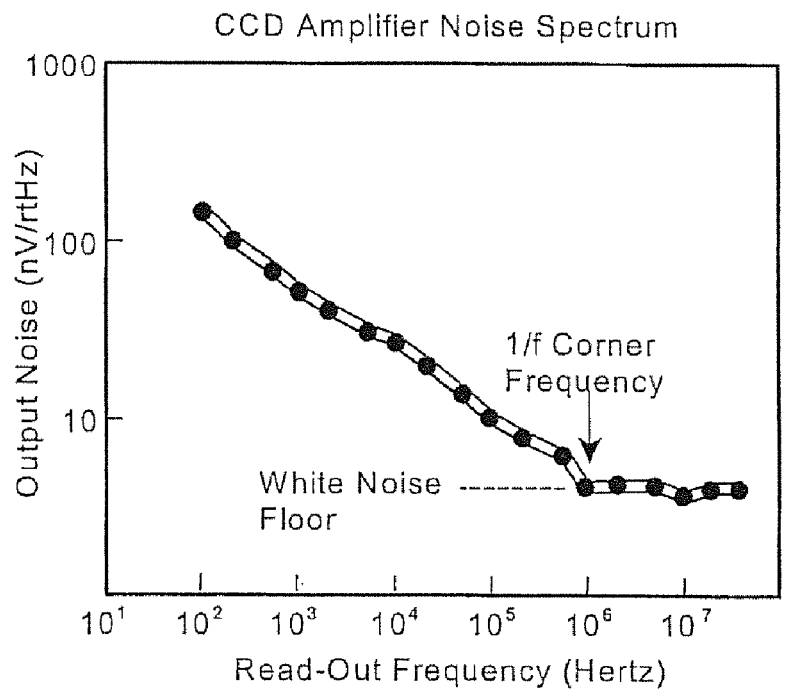
FIG. 1 illustrates flicker noise.
Figure 2:
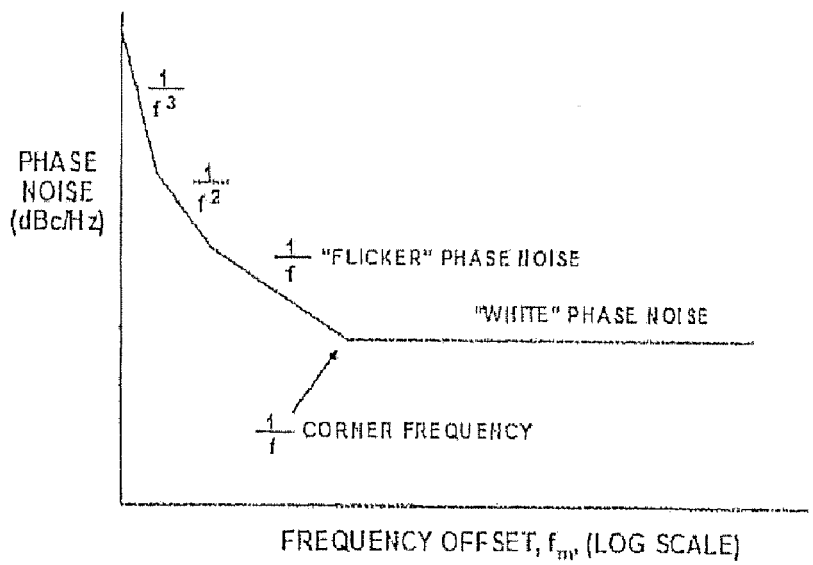
FIG. 2 illustrates flicker noise.
Figure 3:
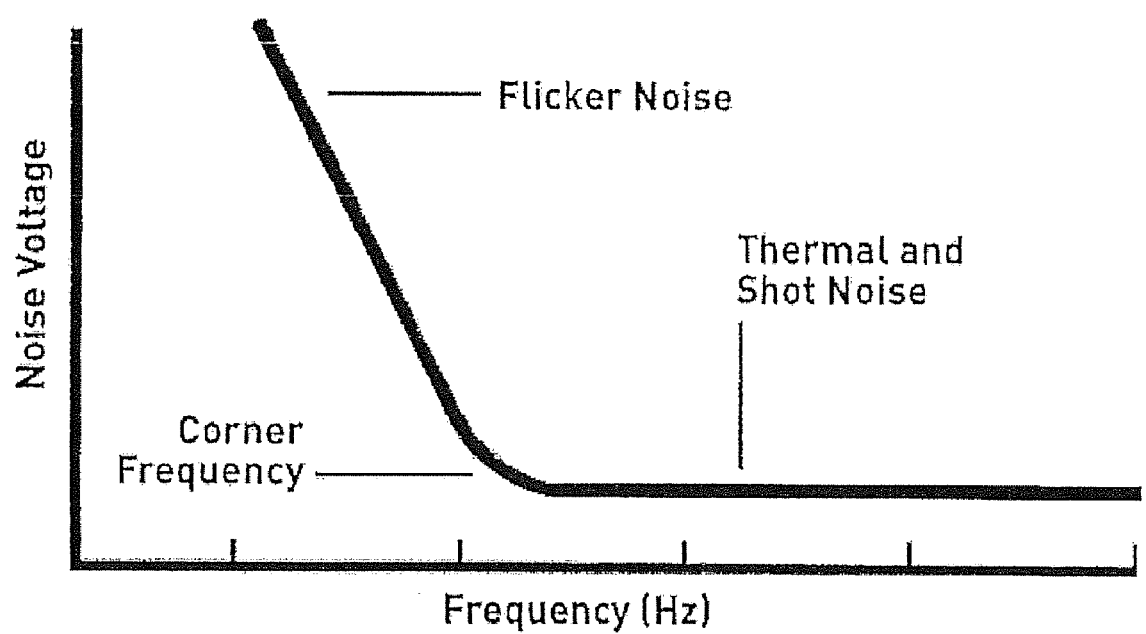
FIG. 3 illustrates flicker noise.

The upper box portion 42 of the environment control enclosure also includes a hinged steel door 68 which pivots outwardly about the pivot axis of a hinge 70 as shown in FIG. 5A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 7:
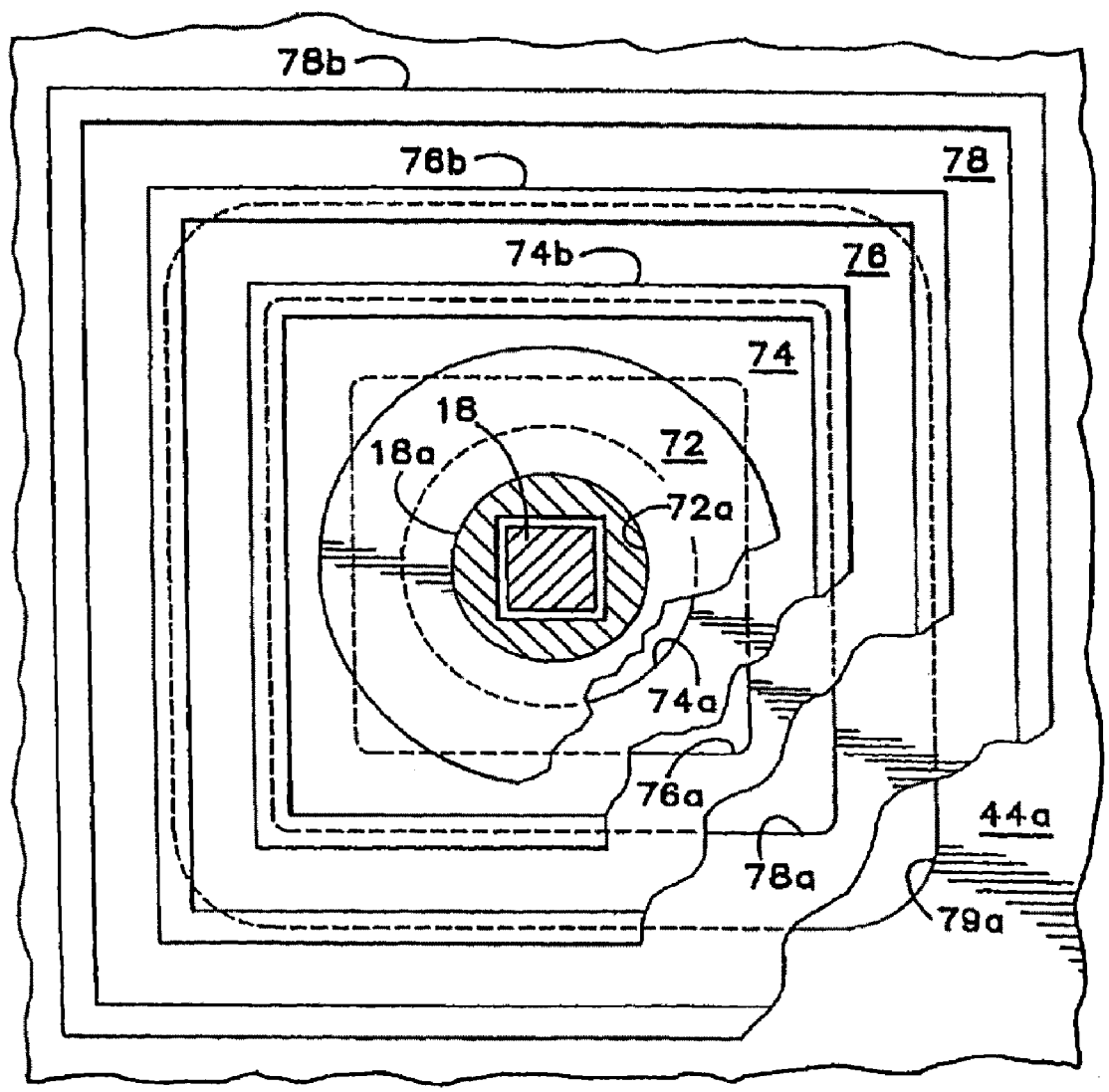
FIG. 7 is a top view of the sealing assembly where the motorized positioning mechanism extends through the bottom of the enclosure.

With reference to FIGS. 6 and 7, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Figure 9:
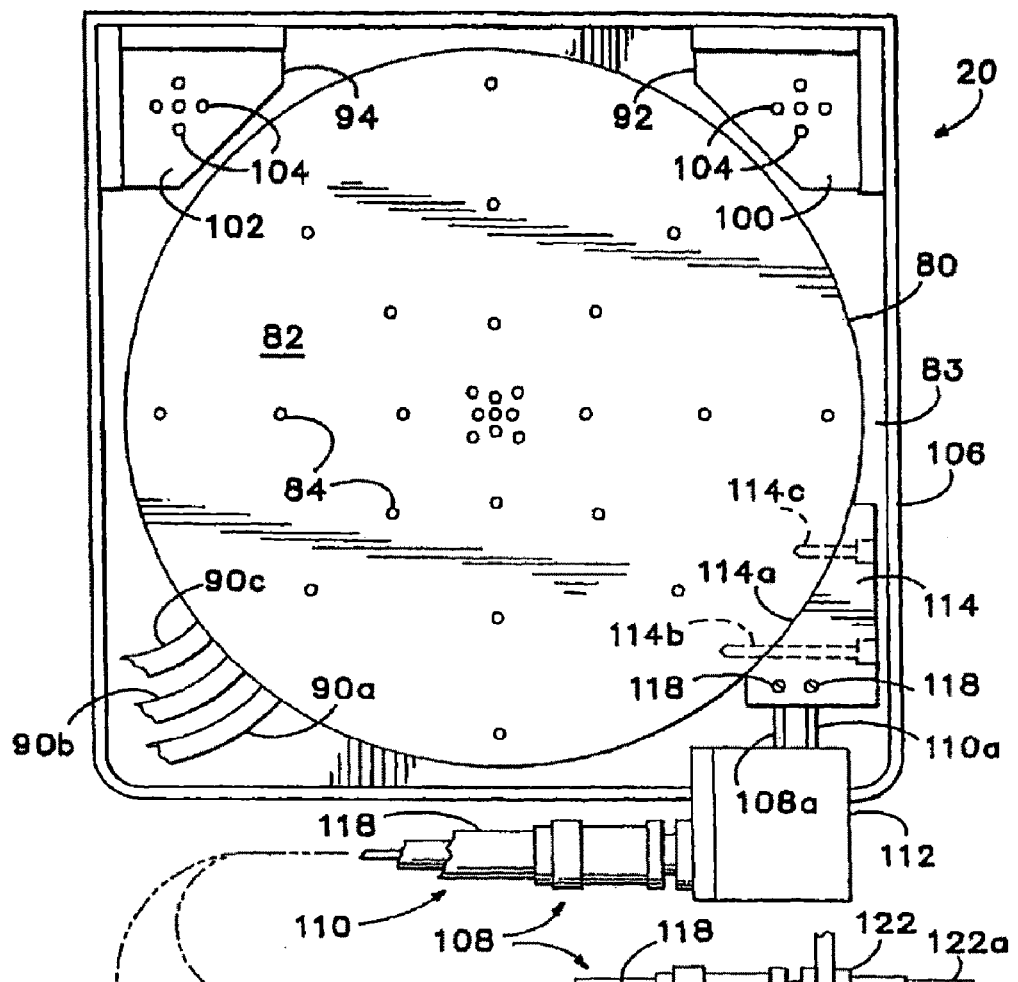
FIG. 9 is a partially schematic top detail view of the chuck assembly, taken along line 9-9 of FIG. 6.
Figure 10:
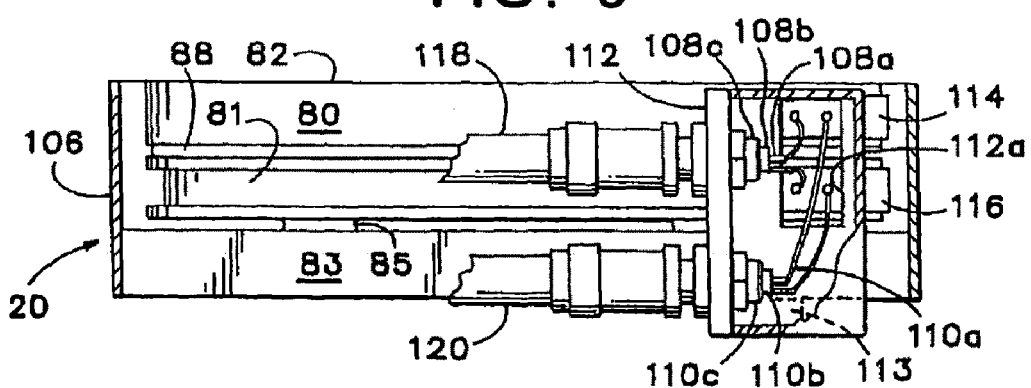
FIG. 10 is a partially sectional front view of the chuck assembly of FIG. 9.

With particular reference to FIGS. 6, 9 and 10, the chuck assembly 20 is of a unique modular construction usable either with or without an environment control enclosure. The plunger 18 supports an adjustment plate 79 which in turn supports the first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 9) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other DUT is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 6 and 6A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 6, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E.I. DuPont.

With reference to FIGS. 9 and 10, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 10. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b.

In any case, the detachable connector assemblies 108, 110, due to their interconnections with the two connector plates 114, 116, provide immediately ready-to-use signal and guard connections to the chuck assembly elements 80 and 81, respectively, as well as ready-to-use guarded Kelvin connections thereto. For applications requiring only guarding of the chuck assembly, as for example the measurement of low-current leakage from a test device through the element 80, it is necessary only that the operator connect a single guarded cable 122a from a test instrument such as a Hewlett-Packard 4142B modular DC source/monitor to the detachable connector 122 so that a signal line is provided to the chuck assembly element 80 through the connector element 108a and connector plate 114, and a guard line is provided to the element 81 through the connector element 108b and connector plate 116. Alternatively, if a Kelvin connection to the chuck assembly is desired for low-voltage measurements, such as those needed for measurements of low capacitance, the operator need merely attach a pair of cables 122a and 124a to the respective connectors 122, 124 from a suitable test instrument such as a Hewlett-Packard 4284A precision LCR meter, thereby providing both source and measurement lines to the element 80 through the connector elements 108a and 110a and connector plate 114, and guarding lines to the element 81 through the connector elements 108b and 110b and connector plate 116.

Figure 11:
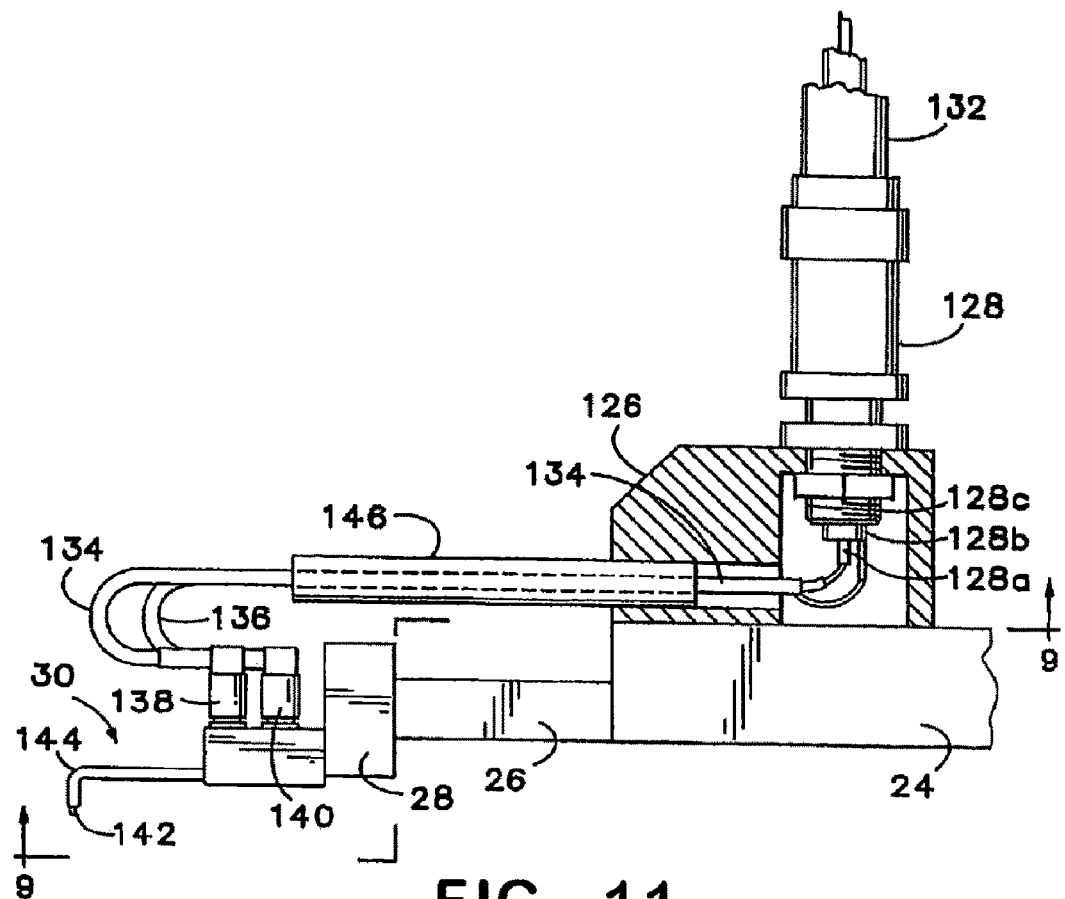
FIG. 11 is a partially sectional side view of a probe holder and probe.
Figure 12:
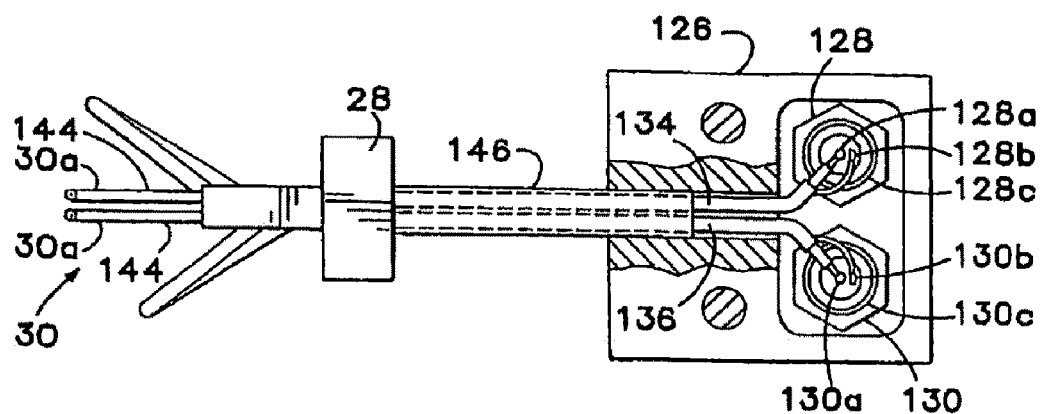
FIG. 12 is a partially sectional bottom view taken along line 12-12 of FIG. 11.

With reference to FIGS. 8B, 11 and 12, respective individually movable probes 30 comprising pairs of probe elements 30a are supported by respective probe holders 28 which in turn are supported by respective extending portions 26 of different probe positioners such as 24. Atop each probe positioner 24 is a shield box 126 having a pair of triaxial connectors 128, 130 mounted thereon with respective triaxial cables 132 entering each triaxial connector from a suitable test instrument as mentioned previously. Each triaxial connector includes a respective inner connector element 128a, 130a, an intermediate connector element 128b, 130b, and an outer connector element 128c, 130c in concentric arrangement. Each outer connector element 128c, 130c terminates by connection with the shield box 126. Conversely, the inner connector elements 128a, 130a, and the intermediate connector elements 128b, 130b, are connected respectively to the inner and outer conductors of a pair of coaxial cables 134, 136 which therefore are guarded cables. Each cable 134, 136 terminates through a respective coaxial connector 138, 140 with a respective probe element 30a having a center conductor 142 surrounded by a guard 144. In order to provide adequate shielding for the coaxial cables 134, 136, especially in the region outside of the octagonal box 48, an electrically-conductive shield tube 146 is provided around the cables 134, 136 and electrically connected through the shield box 126 with the outer connector element 128c, 130c of the respective triaxial connectors 128, 130. The shield tube 146 passes through the same slit in the foam 50 as does the underlying extending member 26 of the probe positioner 24. Thus, each individually movable probe 30 has not only its own separate individually movable probe holder 28 but also its own individually movable shield 146 for its guarded coaxial cables, which shield is movable in unison with the probe holder independently of the movement of any other probe holder by any other positioning mechanism 24. This feature is particularly advantageous because such individually movable probes are normally not equipped for both shielded and guarded connections, which deficiency is solved by the described structure. Accordingly, the probes 30 are capable of being used with the same guarding and Kelvin connection techniques in a ready-to-use manner as is the chuck assembly 20, consistently with full shielding despite the individual positioning capability of each probe 30.

Flicker noise is proportional to the DC current through the device and flicker noise measurements are closely tied to the DC bias on the device. The measurement of the flicker noise is typically preceded by DC characterization of the device under test (DUT). DC measurements are used to calculate transconductance ($G_m$) and channel conductance ($R_m$) which are used in the flicker noise data presentation. For DC characterization, the device is biased and its performance is measured. During DC characterization, the signal paths between the device and the various instruments of the test setup should be guarded so that accurate measurements of DC currents can be made in the femto-amp range which is characteristic of small devices.

Figure 13:
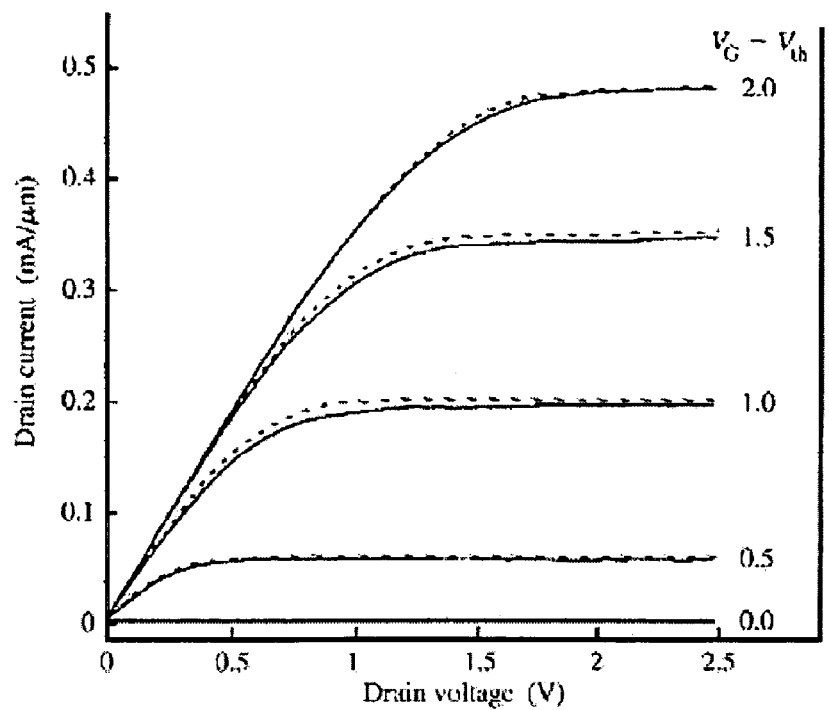
FIG. 13 illustrates field effect transistor (FET) characteristics.
Figure 14:
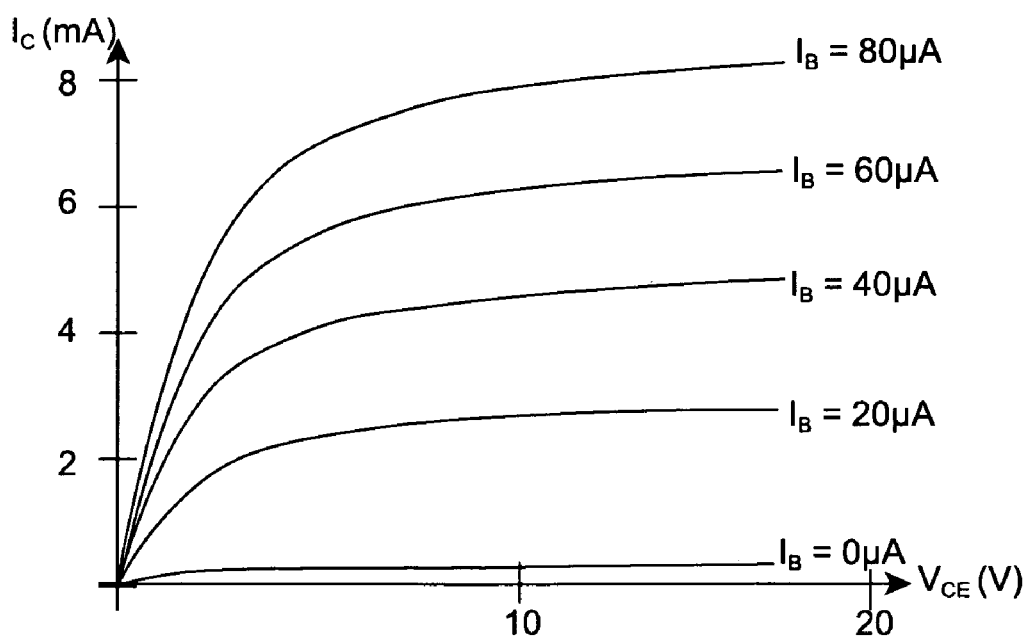
FIG. 14 illustrates bipolar junction transistor (BJT) device characteristics.

Referring to FIG. 13, an $I_D$-$V_D$ plot for a typical FET is illustrated. Referring to FIG. 14, a typical Ic-Vce plot for a typical bipolar transistor is illustrated. In order to properly set up the operating point for a transistor, or other device under test, its DC characteristics should be accurately measured. It is typically desirable to determine voltage and/or current levels relatively accurately so that the bias point characteristics of the device under test can be determined. This is typically performed by sweeping or stepping the voltages and/or currents applied to the device under test. Thereafter, for flicker noise measurements it is normally desired that subsequent testing is performed in the linear region characteristic of the device under test, which is typically the steeper portion on the left hand side of the characteristic curves. In order to obtain sufficiently accurate measurements, especially for exceptionally small devices operating where the measurements need to be in the femto-amp range, it is preferable that one or more of the respective signal paths of the source, the load and the substrate signals should be guarded paths. Thus, a sufficiently precise bias point for the device under test can be determined for subsequent flicker noise measurements by measuring the characteristic curves of the device under test. Further, to maintain signal and probing integrity and to minimize the introduction of noise, it is highly desirable that no changes be made in the cabling between the DC characterization and flicker noise measurements.

Figure 15:
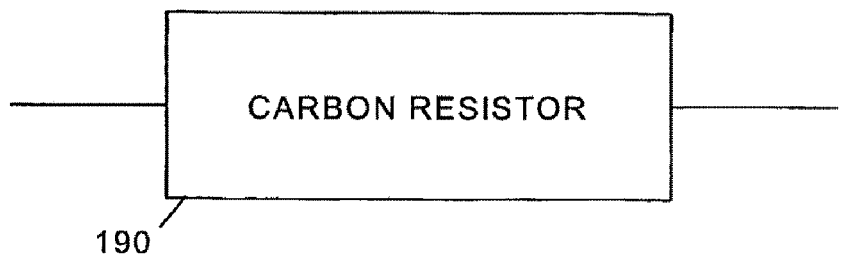
FIG. 15 illustrates a carbon resistor.

Referring to FIG. 15, in the case of a carbon resistor 190 the resistive material, at the molecular level, has discontinuities so the current path through the resistor tends to vary over time. The slight path variations tend to correspondingly change the value of the resistance over time and produce noise.

Figure 16:
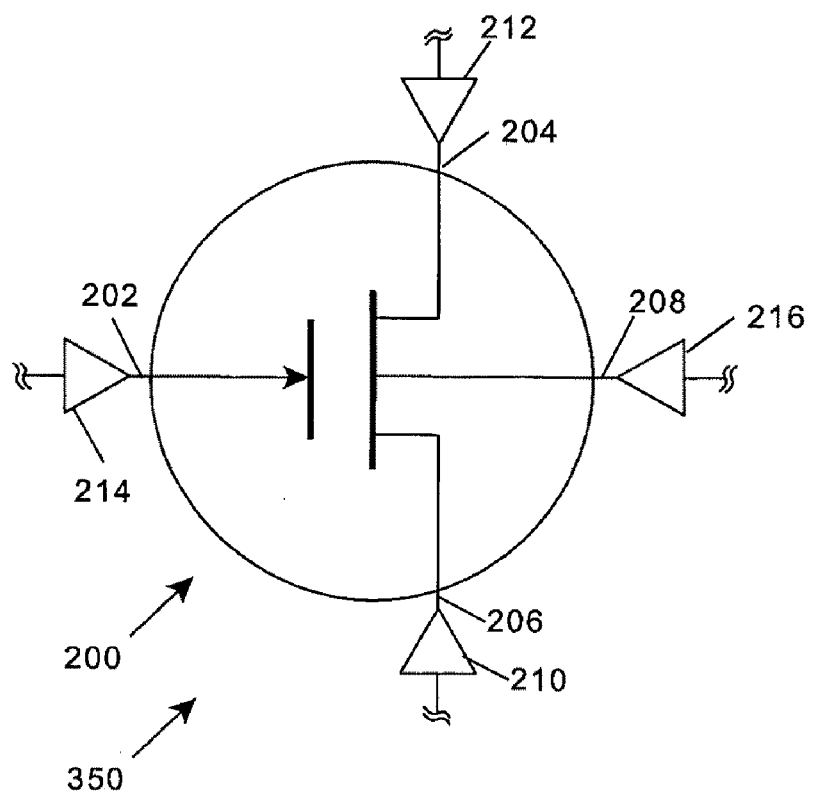
FIG. 16 schematically illustrates a device under test, a field effect transistor (FET), and a set of test probe tips.
Figure 23:
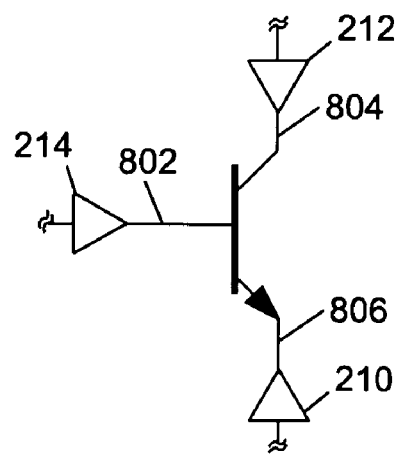
FIG. 23 schematically illustrates a bipolar junction transistor (BJT) as a device under test and an engaging set of test probe tips.

Referring to FIG. 16, an N-channel field-effect transistor (FET) 200 is illustrated as including a gate 202, a drain 204, a source 206, and a substrate 208 terminal. All FETs have a gate, drain, and source terminal that are roughly similar to the base 802, collector 804, and emitter 806 of bipolar junction transistors (BJT), as illustrated in FIG. 23, and, like bipolar junction transistors are known as three terminal devices. Aside from the JFET, all FETs also have a fourth terminal called the body, base, bulk, or substrate 208. This fourth terminal serves the technical purpose of biasing the transistor into operation; it is rare to make non-trivial use of the substrate terminal in circuit designs, but its presence can be important when setting up the physical layout of an integrated circuit.

The names of the terminals refer to their functions. The gate terminal 202 may be thought of as controlling the opening and closing of a physical gate. This gate permits electrons to flow through or blocks their passage by, respectively, creating or eliminating a channel between the source 206 and drain 204. Electrons flow from the source terminal towards the drain terminal if influenced by an applied voltage. The body or substrate simply refers to the bulk of the semiconductor in which the gate, source and drain lie. Usually the body terminal is connected to the highest or lowest voltage within the circuit, depending on type. The body terminal and the source terminal are sometimes connected together since the source is also sometimes connected to the highest or lowest voltage within the circuit; however there are several uses of FETs which do not have such a configuration, such as transmission gates and cascade circuits.

Figure 17:
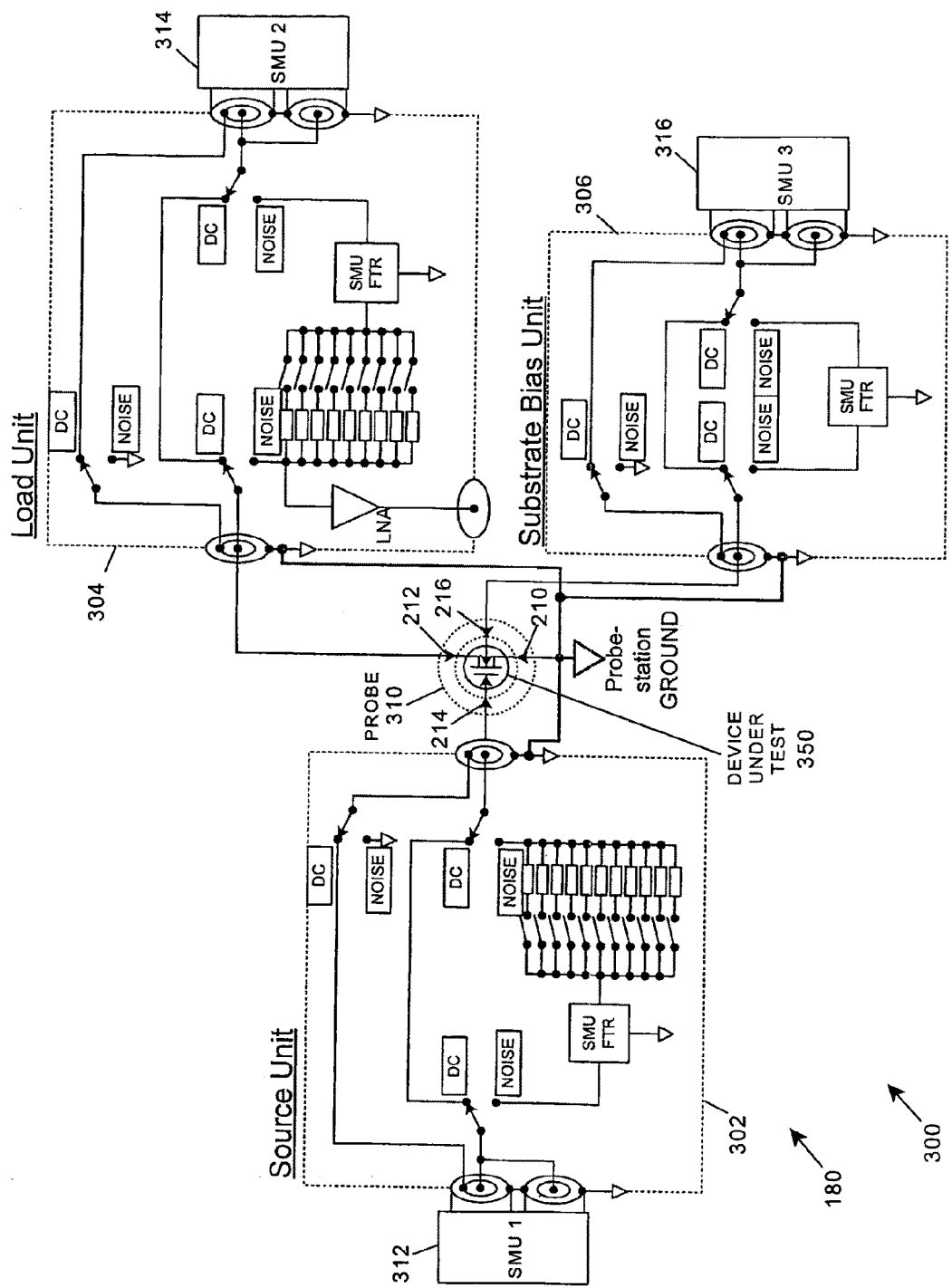
FIG. 17 illustrates a flicker noise setup with a three terminal device under test, a set of probes, a source unit, a load unit, and a substrate bias unit.
Figure 18:
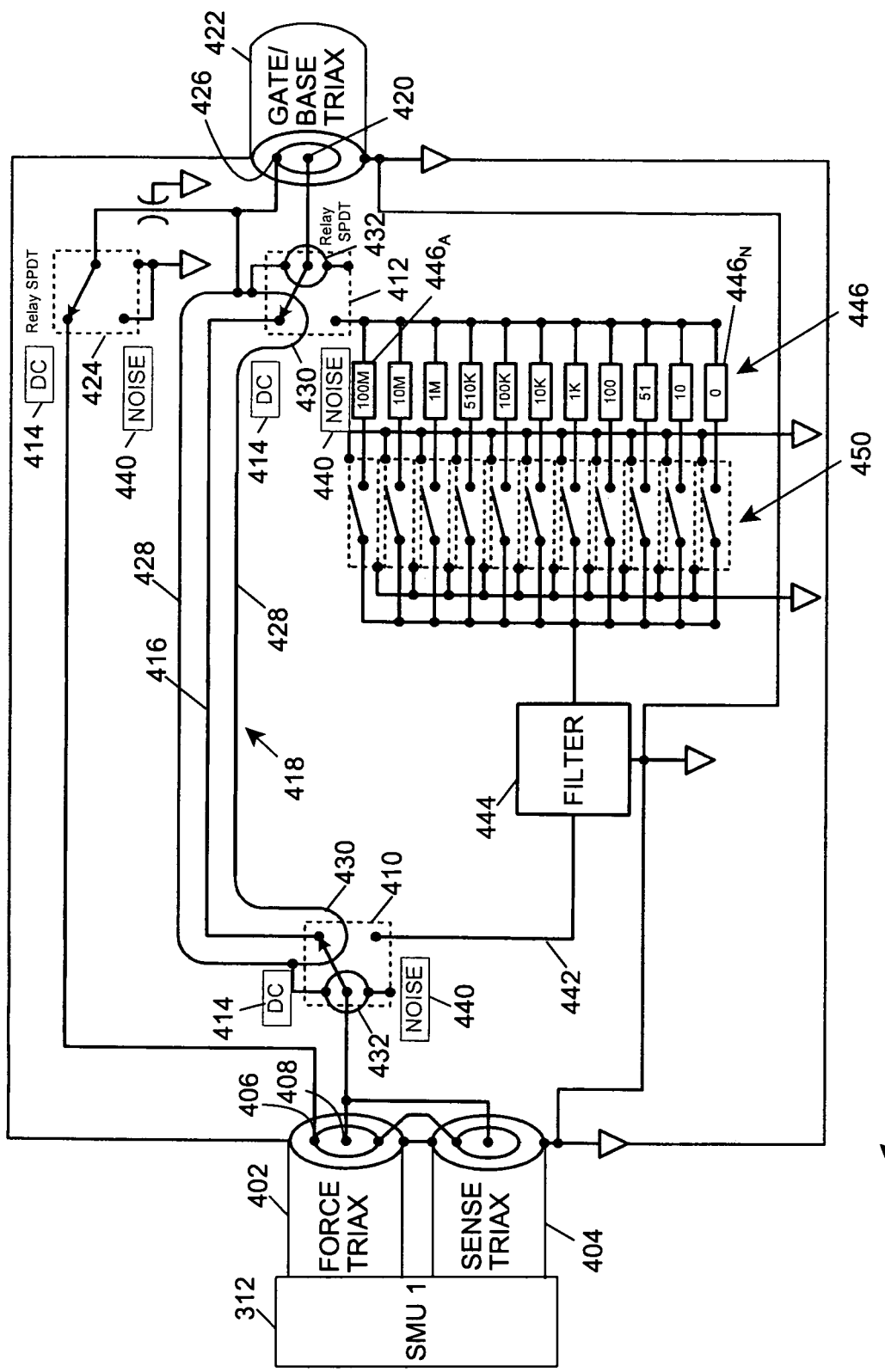
FIG. 18 illustrates the source unit of the flicker noise test system of FIG. 15.

Referring to FIGS. 17 and 18, a flicker noise test system 300 may include a signal capture module 180 which is preferably mounted on the platen 12 adjacent the appropriate probe positioner 24. The signal capture unit preferably includes switches, resistors, filters and amplifiers of a source unit 302, a load unit 304, and a substrate bias unit 306. The flicker noise test system also includes a probe 310 including a plurality of probe tips, a device under test (DUT) 350 and other associated components. A three terminal DUT, commonly includes a source 206, a drain 204, a gate 202 or similar terminals and, in the case of an FET, a fourth, substrate 208, terminal. One or more probes may be connected to the source 206, drain 204, gate 202, and substrate 208. A probe 210 may be electrically interconnected to the source 206 or otherwise the source is typically connected to a ground potential. A probe 212 may be electrically interconnected to the drain 204. A probe 214 may be electrically interconnected to the gate 202. A probe 216 may be electrically interconnected to the substrate 208. In some cases, the substrate 208 is electrically interconnected to the source 206. In this manner, each of the interconnections to the device under test are electrically interconnected to a probe or otherwise a contacting element.

Referring also to FIG. 18, the gate (or other element) of the device under test 350 is provided with a direct current bias voltage from a source unit 312. In the case of an FET as the device under test, the base current is nearly zero. In the case of a bipolar junction transistor as the device under test, the base current is larger. In order to accurately obtain flicker noise, especially down to the femto-amp region for small devices, it is important that the signal provided to the gate 202 of the device under test 350 be accurately determined.

In many probing situations, the leakage current associated with a direct current (not significantly changing) signal is considered negligible. However, the flicker noise occurs at exceptionally low signal levels and, when attempting to measure the flicker noise of very small devices, even the most minor levels of noise in the signal path can make the measurements difficult, if not impossible to obtain. In some measurements, for example, the DC characterization of a DUT, a signal path may be provided with an associated guard signal path. A guard signal path is used for suppressing interchannel leakage currents by surrounding the inner core of each coaxial lead-in wire with a cylindrical "guard" conductor. The guard conductor is maintained at the same potential as the inner core by a feedback circuit in the output channel of the power source. Because the voltage potentials of the outer guard conductor and the inner conductive core, the signal path, are made to substantially track each other, negligible leakage current will flow across the inner dielectric that separates these conductors regardless of whether the inner dielectric is made of a material having a low- or a high-resistivity. Although leakage current can still flow between the guard conductors of the respective cables, this is typically not a problem because these guard conductors, unlike the inner conductive cores, are at low impedance.

Figure 21:
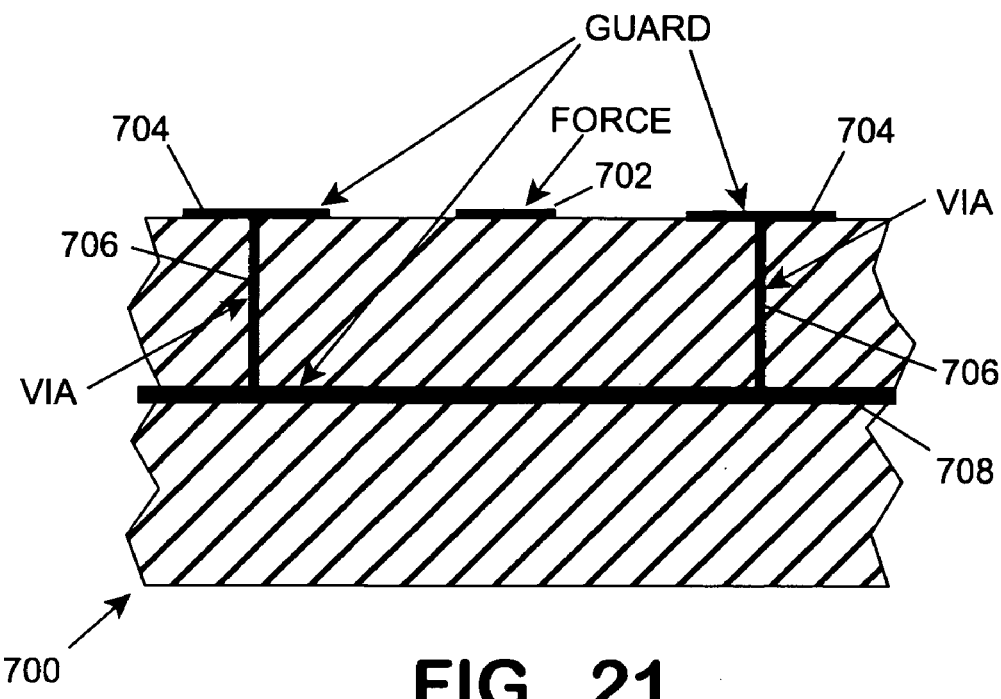
FIG. 21 is a cross-sectional view of a guarded strip line.

Other structures may likewise be used to provide a guard signal to an associated signal current. Referring to FIG. 21, in the case of a strip line configuration 700 the signal path may be a central conductor 702 (e.g., force signal) and the guard path 704 may be on opposing sides of the signal path, and connected, by vias 706, to a guard path 708 in a plane below the signal path so that the guard path partially surrounds the signal path.

Referring to FIG. 18, the source unit 302 of the flicker noise measurement system provides a conductive connection between a direct current source 312 and the gate 202 of the device under test. The direct current source 312 is preferably a source monitor unit (SMU) which includes direct current voltage and current sources and measurement capabilities. The SMU, which is typically connected to the source unit by triaxial cables 402, 404, can impose a guard signal on the coaxial conductor 406, the guard path, surrounding the signal path, the central conductor 408 of the triaxial cable which conducts the direct current voltage and current signal. By using a guarding technique on the direct current signal, significant improvement may be realized in the low-level current measuring capability, especially in the femto-amp range which is appropriate for many devices. For DC characterization measurements, relays 410 and 412 of the source unit are operated so as to conduct in a DC position 414 and the gate signal path comprising the center conductor 408 of the triaxial cable 402 connecting the SMU and the source unit; a conductor 416 connecting the two relays and the center conductor 420 of a triaxial cable 422 conductively connecting the source unit to the probe tip 214, conductively connects the source, SMU 312, to the DUT's gate 202 terminal. A third relay 424 of the source unit is also operated to conduct in the DC position 414, conductively connecting the coaxial conductor 406 of the cable 402 from the SMU to the source unit to the coaxial conductor 420 of the cable 422 connecting the source unit to the probe. The guard signal path also includes a portion 428 that at least partially surrounds the signal path 416 which may be part of a strip line 418 connecting the relays 410 and 412. This portion of the guard signal path may also be part of the strip line and is preferably extended to portions 430, 432 that provide the guarding function at the terminals of the relays 410, 412. Preferably, the signal path of the probe tip 214 is connected to the signal path 416 of the source unit 302 by the center conductor 420 of the triaxial cable 422. Also, the guard path from the probe tip 214 is connected to the guard path 406 of the cable connecting the SMU to the source unit. In this manner, a guard signal provided to the source unit is maintained through the source unit 302 to a guard path on the probe and to a region proximate the device under test 350. In any event, the signal path for the direct current gate signal should include an associated guard signal path from the input to the output of the source unit so as to reduce the signal leakage paths.

Figure 19:
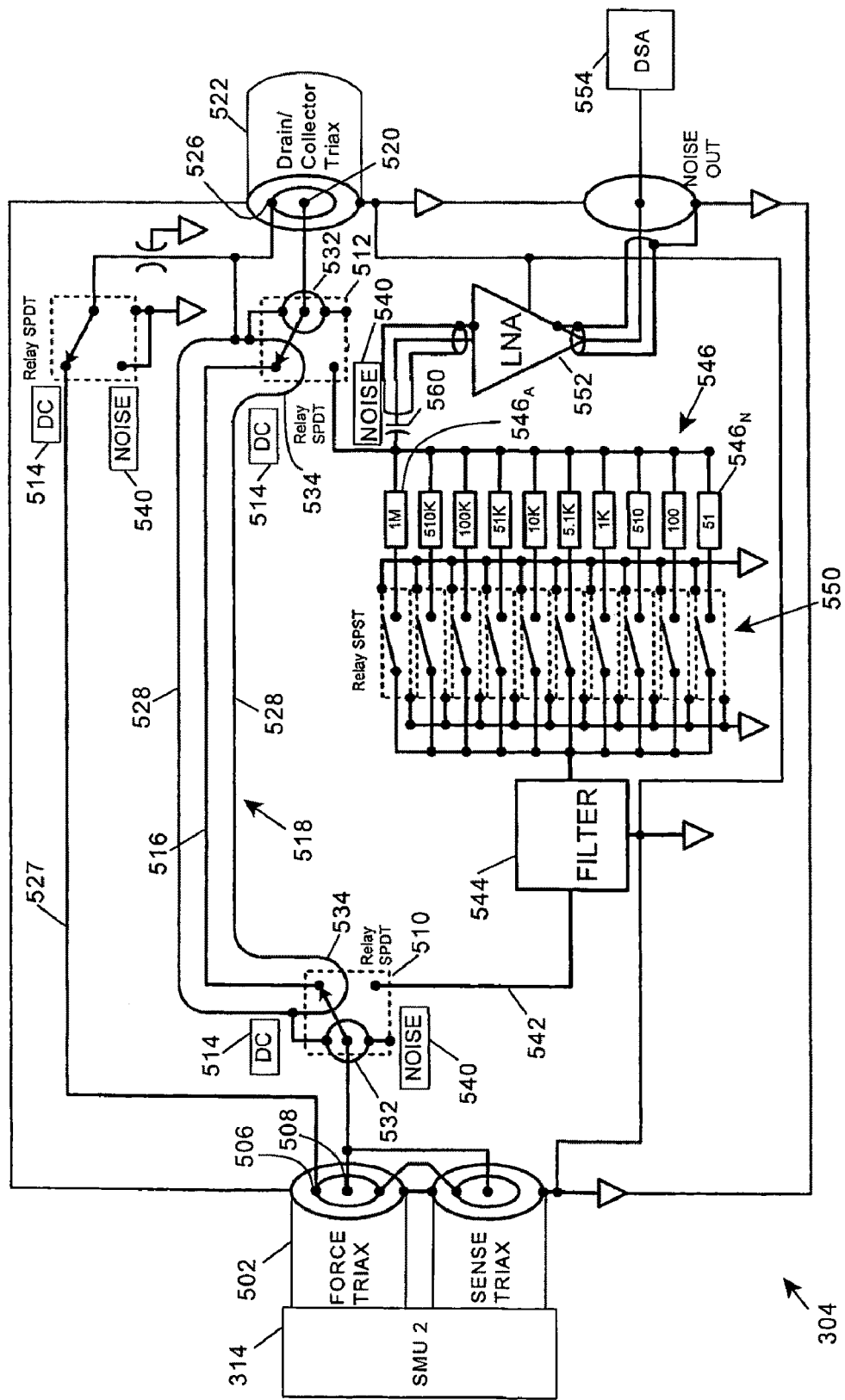
FIG. 19 illustrates the load unit of the flicker noise test system of FIG. 15.

Referring to FIG. 19, for DC measurements, a guard signal path is also, preferably, provided in the load unit 304. For DC measurements, relays 510 and 512 of the load unit are operated so as to conduct in the DC position 514 and the load signal path, comprising the center conductor 508 of a triaxial cable 502 connecting the second SMU 314 and the load unit; a conductor 516 connecting the two relays and the center conductor 520 of a triaxial cable 522 conductively connecting the load unit to the probe tip 212, conductively connects the source of load power, the second SMU 314, to the DUT's drain 204 terminal. A third relay 524 of the load unit is also operated to conduct in the DC position 514, conductively connecting the coaxial conductor 526 of the cable 522 from the SMU to the load unit to the coaxial conductor 526 of the cable 522 connecting the load unit to the probe. The coaxial conductor 526 of the cable 522 provides a load guard path from the probe tip 212 to the guard signal path 527 of the load unit. The guard signal path includes a portion 528 that at least partially surrounds the load signal path 516 connecting the relays 510 and 512. This portion of the load guard signal path may be part of a strip line 518 and is preferably extended to portions 532, 534 that provide guarding for the terminals of the relays 510, 512. In this manner, a guard signal provided to the load unit is maintained through the load unit to the probe and to a load guard path on the probe to a region proximate the drain of the DUT 350. In any event, the signal path for the direct current drain signal should include an associated guard signal path from the input to the output of the load unit so as to reduce the signal leakage paths. By using a guarding technique on the direct current signal, significant improvement may be realized in the low-level current measuring capability, especially in the femto-amp range.

Figure 20:
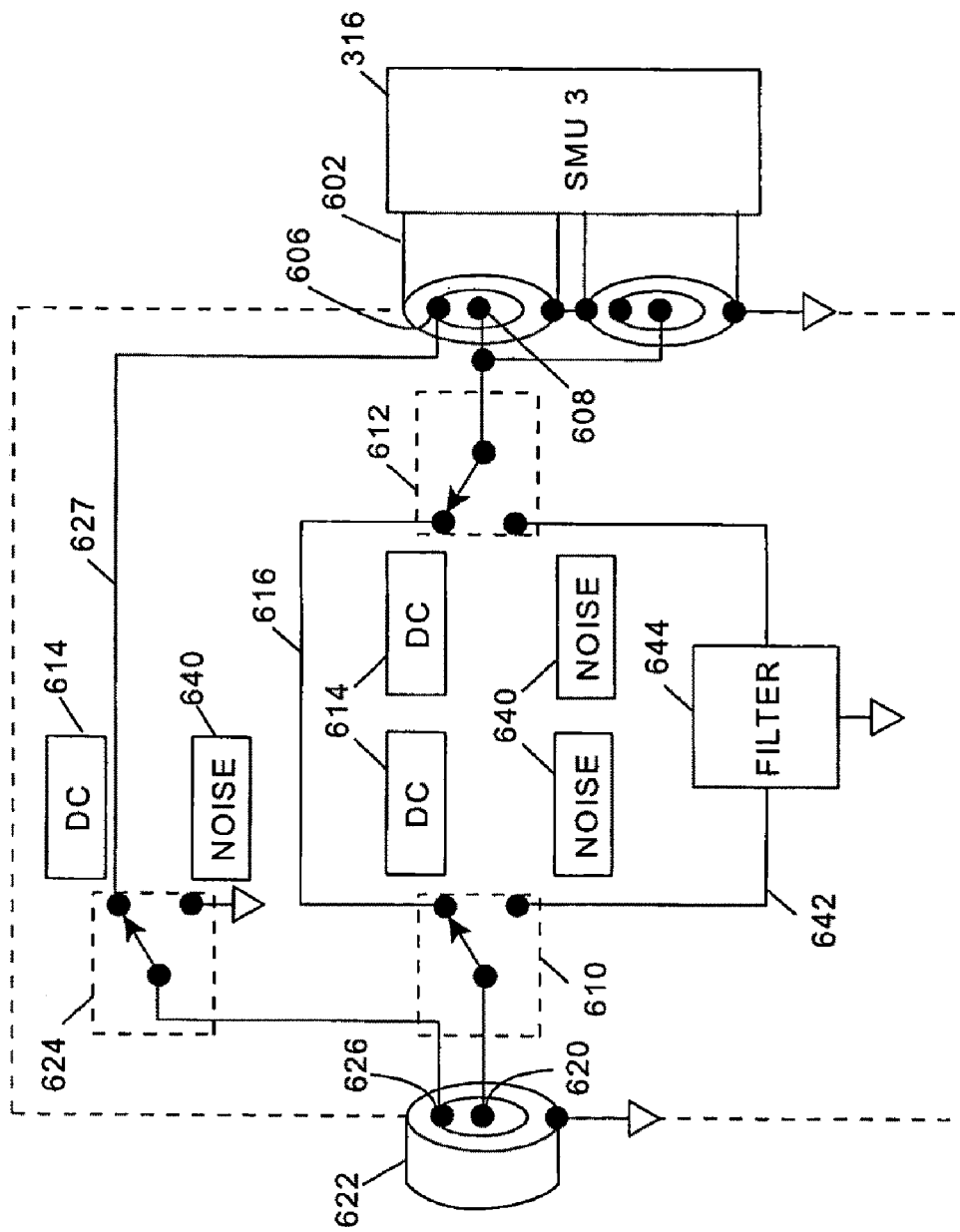
FIG. 20 illustrates the substrate bias unit of the flicker noise test system of FIG. 15.
Figure 24:
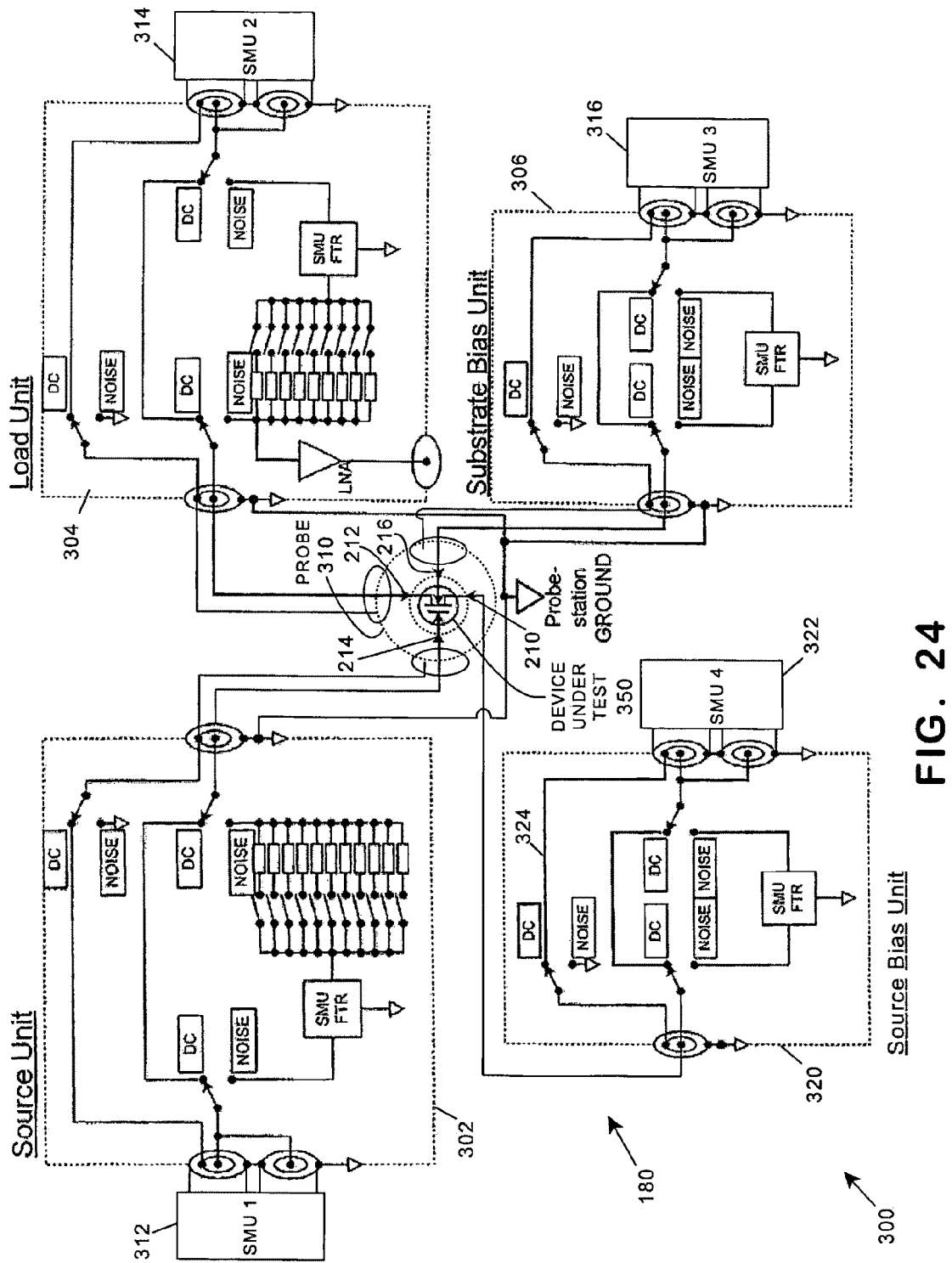
FIG. 24 illustrates a flicker noise setup with a four terminal device under test, a set of probes, a source unit, a load unit, a source bias unit and a substrate bias unit.

Referring to FIG. 20, the substrate bias unit 306 also includes a trio of relays 610, 612 and 624 that may be operated to configure a substrate bias signal path 616 for direct current measurement operation. When the relays are shifted to the DC position 614, the substrate bias signal path is conductively connected from the center conductor 620 of the triaxial cable 626 connected to the probe tips 210 and 216 in contact with the substrate 208 and source terminals of the DUT to the center conductor 608 of the triaxial cable 602 connecting the substrate bias unit to a third SMU 316 which provides, in the case illustrated in FIG. 17, a ground potential for the source and substrate of the DUT. Shifting the third relay 624 of the substrate bias unit to the DC position 614, conductively connects a portion of a substrate bias guard path 627 of the substrate bias unit between the coaxial guard conductor 626 of the cable 622 connected to the probe tips 210, 216 and the coaxial guard conductor 606 of the triaxial cable 602 connecting the substrate bias unit to the third SMU 316. Imposing a voltage on the substrate bias guard path that is substantially equal to the voltage on the substrate bias signal path reduces the signal leakage. A guard signal provided to the source unit is maintained through the source unit to the probe, and to a guard path on the probe to a region proximate the DUT. In many cases the substrate terminal of the DUT is set to the ground potential, but the substrate terminal of the DUT may set to a different potential. As illustrated in FIG. 17, the source is connected to the same potential as the substrate. However, referring to FIG. 24, the source may be connected to a different potential than the substrate and there may be a source bias unit 320 that provides a separate signal path to the DUT's source terminal 206 and a guard path 324 for the separate signal path for DC characterization.

Preferably, the relays of the source unit, the load unit and substrate bias unit are reed relays which preferably have an OFF resistance of greater than one terra-ohm.

When the DC characteristics of the DUT have been established, a set of measurements may be obtained in order to determine the flicker noise. Depending on the particular device under test, the measurement path may be in any one of the source unit, the load unit, and/or the substrate unit. In some cases, the measurement path may be separate from the source, the load, and the substrate unit, if desired. To maintain signal and probing integrity and to minimize the introduction of extraneous noise, it is highly desirable that the flicker noise measurement system be able to switch from the DC characterization configuration to a flicker noise measurement configuration without having to change any of the cables or probes. The flicker measurement system 300 can be changed from the DC operation mode to the noise measurement mode by causing the respective relays of the source, load and substrate bias units to shift to the NOISE position. While guarded signal paths may be provided in the various units it is typically unnecessary when performing the flicker noise measurement and shifting the relays 410, 412, 424 of the source unit 302 to the noise position 440 disconnects the source signal path and the source signal guard path and connects the noise signal path 442 from the first SMU 312 to the probe tip 214 in conductive contact with the gate 202 of the DUT. The noise signal path 442 of the source unit may include a low-pass filter 444 to block noise from the SMU 312, attenuating higher frequency signals and allowing only DC to be conducted to the DUT.

In many cases, it is desirable to impose a resistance on one or more of the terminals of a DUT to set the impedance of the DUT during flicker noise measurement. The output of the low pass filter 444 of the source unit is connected to a resistor array 446 that includes a plurality of resistors $446_A$-$446_N$ to accommodate a range of DUTs having varying source impedance requirements. To provide a desired load for the gate of the DUT, an appropriate resistor of the array can be selected by actuating an appropriate switch in a switch array 450.

Similarly, the load unit 304 may include a low pass filter 544 in the noise measurement path which is selected by actuating the relays 510, 512, 514 which selects the noise signal path and grounds the load signal guard path 526. Since the desired measurement is flicker noise, it is desirable to include a low-pass filter 544 to ensure that all higher frequency signals provided to the device under test are significantly attenuated. The output of the low pass filter 544 is connected to a resistor array 546 enabling selection of a desired impedance to apply to the drain 204 of the DUT. To provide a desired load to drain of the DUT, the resistance can be selected by operating an appropriate switch in a switch array 550 to interconnect the appropriate resistor with the signal path. While a guarded path may be provided within the load unit along the "noise" path, it is not typically necessary and the guard signal path can be switched to ground by the relay 524.

In many cases, the drain or collector is the desired location to measure the flicker noise. Accordingly, the load unit 304 may include a low noise amplifier (LNA) 552 that provides a signal output from the device under test. The amplifier 552 is preferably electrically interconnected with the noise measurement signal path between the resistors and the DUT, so that there is no significant resistance between the DUT and the amplifier. As illustrated, the load resistor provides a load for the DUT such that a voltage divider is constructed from the drain (FET) or collector (BJT) and the bias voltage source 316. Measurements of the flicker noise are preferably made at the center of this voltage divider. A blocking capacitor 560 with a relatively high capacitance enables measurement of flicker noise with frequencies preferably up to 30 MHz. The flicker noise generated by the DUT passes through the blocking capacitor and is amplified by a low noise amplifier (LNA) 552. The LNA amplifies the noise signals from the DUT while adding little or no noise of its own to the signal.

The flicker noise is measured over a time interval, normally as a result of the self-generated noise due to the device biasing. The measurement device may be any suitable device, such as a digital signal analyzer (DSA) 554 or a spectrum analyzer. The DSA collects the signal from the LNA and converts the signal to a digital format. The digital data may be post processed in order to separate out the flicker noise and display the flicker noise on a display, if desired.

The substrate unit 306 may also include a low pass filter 644. Since the desired measurement is flicker noise, it is desirable to include a low-pass filter in the noise measurement path 642 to ensure that all higher frequency signals provided to the device under test are significantly attenuated. Normally, for the substrate there is no need to provide a resistance so the resistor array may be omitted, if desired. The resistance, if included, may be provided by a resistor array, by using a switch array, to provide a desired load to the DUT. The "noise" path 642 may be selected by switching relays 610, 612, 613 to the noise position 640 which connects the noise signal path to the central conductors 620 and 608 of the coaxial cables connected, respectively, to the probe and the SMU. While a guarded path may be provided within the substrate unit along the "noise" path, it is not typically necessary and in the exemplary substrate unit the guard signal path is connected to ground by actuating relay 624 to the noise position 640.

Figure 22:
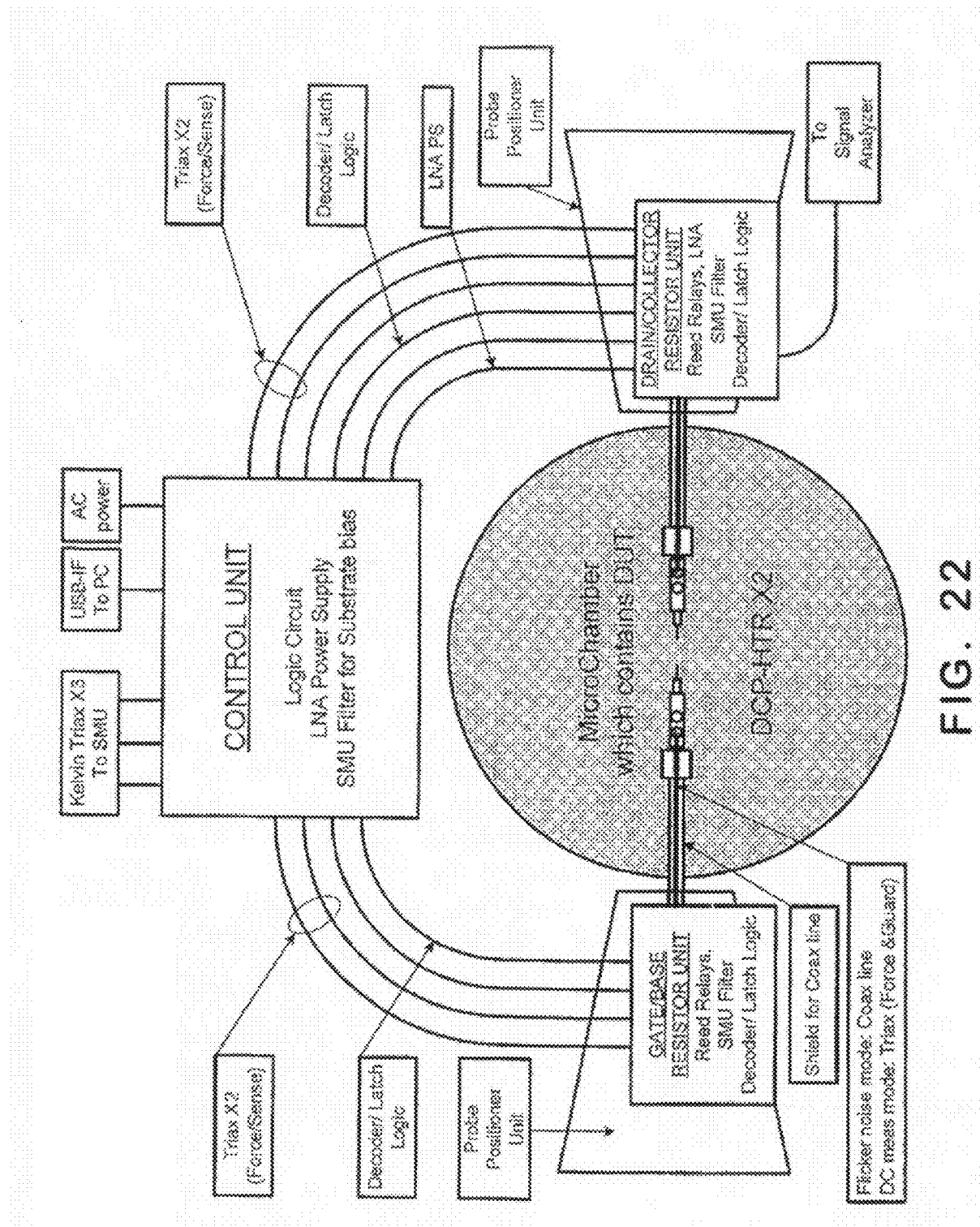
FIG. 22 illustrates a flicker noise test configuration.

An exemplary setup of one configuration of the flicker noise test system is illustrated in FIG. 22.

The flicker noise measurement system provides accurate measurement of flicker noise at frequencies up to 30 MHz characteristic of small DUTs.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A test apparatus for measuring a characteristic of a device under test, said test apparatus comprising:
   (a) a guarded first signal path conductively connected to a signal source and conductively connected to a terminal of said device under test; and
   (b) an unguarded second signal path conductively connected to said signal source and conductively connected to said terminal of said device under test, said first signal path operative to conductively connect said signal source to said terminal without disconnecting portions of said second signal path from said signal source and said terminal and said second signal path operative to conductively connect said signal source to said terminal without disconnecting portions of said first signal path from said signal source and said terminal, wherein said second signal path includes a filter to exclude higher frequency components of a signal from said signal source, and further wherein said second signal path includes a plurality of resistors, each resistor of the plurality of resistors conductively interconnectable with said filter and said terminal by operation of a respective one of a plurality of switches.

2. The test apparatus of claim 1 further comprising:
   (a) a first relay;
   (b) a second relay operable with said first relay to interconnect said signal source and said terminal with one of a portion of said first signal path and a portion of said second signal path, interconnecting said signal source and said terminal with said portion of said first signal path disconnecting said portion of said second signal path from said signal source and said terminal and interconnecting said signal source and said terminal with said portion of said second signal path disconnecting said portion of said first signal path from said signal source and said terminal; and (c) a third relay operable to connect a guard signal path to said signal source when said first signal path interconnects said signal source and said terminal and to disconnect said guard signal path from said signal source when said second signal path interconnects said signal source and said terminal, said guard signal path at least partially surrounding said first signal path for a substantial portion of a length of said first signal path between said signal source and said terminal.

3. The test apparatus of claim 2 wherein at least one of said first relay, said second relay and said third relay comprises a reed relay.

4. The test apparatus of claim 1 wherein said signal source comprises a source monitor unit.

5. The test apparatus of claim 1 wherein said signal source is a first signal source and said terminal is a first terminal, said test apparatus further comprising:

(a) a guarded third signal path conductively connected to a second signal source and conductively connected to a second terminal of said device under test; and (b) an unguarded fourth signal path conductively connected to said second signal source and conductively connected to said second terminal of said device under test, said third signal path operative to conductively connect said second signal source to said second terminal without disconnecting portions of said fourth signal path from said second signal source and said second terminal and said fourth signal path operative to conductively connect said second signal source to said second terminal without disconnecting portions of said third signal path from said second signal source and said second terminal.

6. The test apparatus of claim 5 further comprising:
(a) a fourth relay;
(b) a fifth relay operable with said fourth relay to interconnect said second signal source and said second terminal with one of a portion of said third signal path and a portion of said fourth signal path, interconnecting said second signal source and said second terminal with said portion of said third signal path disconnecting said portion of said fourth signal path from said second signal source and said second terminal and interconnecting said second signal source and said second terminal with said portion of said fourth signal path disconnecting said portion of said third signal path from said second signal source and said second terminal; and (c) a sixth relay operable to connect a second guard signal path to said second signal source when said third signal path interconnects said second signal source and said second terminal and to disconnect said second guard signal path from said second signal source when said fourth signal path interconnects said second signal source and said second terminal, said second guard signal path at least partially surrounding said third signal path for a substantial portion of a length of said third signal path between said second signal source and said second terminal.

7. The test apparatus of claim 5 wherein said fourth signal path includes a filter to exclude higher frequency components of a signal conducted between said second terminal and said second signal source.

8. The test apparatus of claim 5 wherein said second signal source comprises a second source monitor unit.

9. The test apparatus of claim 5, wherein:
(a) a guarded fifth signal path conductively connected to a third signal source and conductively connected to a third terminal of said device under test; and (b) an unguarded sixth signal path conductively connected to said third signal source and conductively connected to said third terminal of said device under test, said fifth signal path operative to conductively connect said third signal source to said third terminal without disconnecting portions said sixth signal path from said third signal source and said third terminal and said sixth signal path operative to conductively connect said third signal source to said third terminal without disconnecting portions of said fifth signal path from said third signal source and said third terminal.

10. A test apparatus for measuring a characteristic of a device under test, said test apparatus comprising:

(a) a guarded first signal path conductively connected to a first signal source and conductively connected to a first terminal of said device under test;

(b) an unguarded second signal path conductively connected to said first signal source and conductively connected to said first terminal of said device under test, said first signal path operative to conductively connect said first signal source to said first terminal without disconnecting portions of said second signal path from said first signal source and said first terminal and said second signal path operative to conductively connect said first signal source to said first terminal without disconnecting portions of said first signal path from said first signal source and said first terminal;

(c) a guarded third signal path conductively connected to a second signal source and conductively connected to a second terminal of said device under test;

(d) an unguarded fourth signal path conductively connected to said second signal source and conductively connected to said second terminal of said device under test, said third signal path operative to conductively connect said second signal source to said second terminal without disconnecting portions of said fourth signal path from said second signal source and said second terminal and said fourth signal path operative to conductively connect said second signal source to said second terminal without disconnecting portions of said third signal path from said second signal source and said second terminal;

(e) a guarded fifth signal path conductively connected to a third signal source and conductively connected to a third terminal of said device under test; and (f) an unguarded sixth signal path conductively connected to said third signal source and conductively connected to said third terminal of said device under test, said fifth signal path operative to conductively connect said third signal source to said third terminal without disconnecting portions of said sixth signal path from said third signal source and said third terminal and said sixth signal path operative to conductively connect said third signal source to said third terminal without disconnecting portions of said fifth signal path from said third signal source and said third terminal.

11. The test apparatus of claim 10 wherein said sixth signal path includes a filter to exclude higher frequency components of a signal from said third signal source.

12. The test apparatus of claim 11 wherein said sixth signal path further includes a resistor conductively connecting said filter and said third terminal.

13. The test apparatus of claim 11 wherein said sixth signal path includes a plurality of resistors, each resistor of the plurality of resistors conductively interconnectable with said filter and said third terminal by operation of a respective one of a plurality of switches.

14. The test apparatus of claim 13 further comprising:
(a) a low noise amplifier having an output and an input, which is connected to said sixth signal path between said individual resistor and said third terminal; and
(b) a test instrument connected to said output of said low noise amplifier.

15. The test apparatus of claim 10 further comprising:
(a) a seventh relay;
(b) a eighth relay operable with said seventh relay to interconnect said third signal source and said third terminal with one of a portion of said fifth signal path and a portion of said sixth signal path, interconnecting said third signal source and said third terminal with said portion of said fifth signal path disconnecting said portion of said sixth signal path from said third signal source and said third terminal and interconnecting said third signal source and said third terminal with said portion of said sixth signal path disconnecting said portion of said fifth signal path from said third signal source and said third terminal; and
(c) a ninth relay operable to connect a third guard signal path to said third signal source when said fifth signal path interconnects said third signal source and said third terminal and to disconnect said third guard signal path from said third signal source when said sixth signal path interconnects said third signal source and said third terminal, said third guard signal path at least partially surrounding said fifth signal path for a substantial portion of a length of said fifth signal path between said third signal source and said third terminal.

16. The test apparatus of claim 15 wherein a portion of said first, said second, said third, said fourth, said fifth and said sixth signal paths; and said first, said second, said third, said fourth, said fifth, said sixth, said seventh, said eighth and said ninth relays and at least two resistors are secured to a holder of a probe having probe tips operable to connect said signal paths to the respective first, second and third terminals of said device under test.

17. The test apparatus of claim 10 wherein said third signal source comprises a third source monitor unit.

18. The test apparatus of claim 10 further comprising:
(a) a guarded seventh signal path conductively connected to a fourth signal source and conductively connected to a fourth terminal of said device under test; and
(b) an unguarded eighth signal path conductively connected to said fourth signal source and conductively connected to said fourth terminal of said device under test, said seventh signal path operative to conductively connect said fourth signal source to said fourth terminal without disconnecting portions of said eighth signal path from said fourth signal source and said fourth terminal and said fourth signal path operative to conductively connect said fourth signal source to said fourth terminal without disconnecting portions of said seventh signal path from said fourth signal source and said fourth terminal.

19. The test apparatus of claim 18 further comprising:
(a) a tenth relay;
(b) a eleventh relay operable with said tenth relay to interconnect said fourth signal source and said fourth terminal with one of a portion of said seventh signal path and a portion of said eighth signal path, interconnecting said fourth signal source and said fourth terminal with said portion of said seventh signal path disconnecting said portion of said eighth signal path from said fourth signal source and said fourth terminal and interconnecting said fourth signal source and said fourth terminal with said portion of said eighth signal path disconnecting said portion of said seventh signal path from said fourth signal source and said fourth terminal; and
(c) a twelfth relay operable to connect a fourth guard signal path to said fourth signal source when said seventh signal path interconnects said fourth signal source and said fourth terminal and to disconnect said fourth guard signal path from said fourth signal source when said eighth signal path interconnects said fourth signal source and said fourth terminal, said fourth guard signal path at least partially surrounding said seventh signal path for a substantial portion of a length of said seventh signal path between said fourth signal source and said fourth terminal.

20. The test apparatus of claim 19 wherein said eighth signal path includes a filter to exclude higher frequency components of a signal conducted between said fourth terminal and said fourth signal source.

21. The test apparatus of claim 19 wherein said fourth signal source comprises a fourth source monitor unit.

22. The test apparatus of claim 10, wherein said second signal path includes a filter to exclude higher frequency components of a signal from said first signal source.

23. The test apparatus of claim 22, wherein said second signal path includes a plurality of resistors, each resistor of the plurality of resistors conductively interconnectable with said filter and said first terminal by operation of a selected one of a plurality of switches.

* * * * *